US011378881B2

(12) United States Patent
Tanaka et al.

(10) Patent No.: US 11,378,881 B2
(45) Date of Patent: Jul. 5, 2022

(54) COMPOSITION FOR HOLOGRAPHIC RECORDING MEDIUM, CURED PRODUCT FOR HOLOGRAPHIC RECORDING MEDIUM, AND HOLOGRAPHIC RECORDING MEDIUM

(71) Applicant: MITSUBISHI CHEMICAL CORPORATION, Tokyo (JP)

(72) Inventors: Asato Tanaka, Tokyo (JP); Takanori Shimizu, Tokyo (JP)

(73) Assignee: MITSUBISHI CHEMICAL CORPORATION, Tokyo (JP)

(*) Notice: Subject to any disclaimer, the term of this patent is extended or adjusted under 35 U.S.C. 154(b) by 0 days.

(21) Appl. No.: 17/104,026

(22) Filed: Nov. 25, 2020

(65) Prior Publication Data

US 2021/0080826 A1    Mar. 18, 2021

Related U.S. Application Data

(63) Continuation of application No. PCT/JP2019/022924, filed on Jun. 10, 2019.

(30) Foreign Application Priority Data

Jun. 11, 2018  (JP) .............................. JP2018-111209
Jun. 11, 2018  (JP) .............................. JP2018-111210

(51) Int. Cl.
*G03H 1/02*     (2006.01)
*G11B 7/245*    (2006.01)
(Continued)

(52) U.S. Cl.
CPC .......... *G03F 7/001* (2013.01); *C08G 18/4277* (2013.01); *G02B 27/0172* (2013.01);
(Continued)

(58) Field of Classification Search
CPC ... G03H 2001/0413; G03H 2001/0264; G03H 2260/12; G03H 2260/14; G03F 7/001;
(Continued)

(56) References Cited

U.S. PATENT DOCUMENTS 8,658,332 B2    2/2014  Askham
2003/0086135 A1  5/2003  Takeyama
(Continued)

FOREIGN PATENT DOCUMENTS

JP    2002311379 A    10/2002
JP    2008134623 A     6/2008
(Continued)

OTHER PUBLICATIONS

Machine translation of JP 2016-206488 (2016).*
(Continued)

*Primary Examiner* — Martin J Angebranndt
(74) *Attorney, Agent, or Firm* — Element IP, PLC

(57) ABSTRACT

A holographic recording medium composition contains an isocyanate group-containing compound (component (a-1)), an isocyanate-reactive functional group-containing compound (component (b-1)), a polymerizable monomer (component (c-1)), a photopolymerization initiator (component (d-1)), and a stable nitroxyl radical group-containing compound (component (e-1)). A ratio of the total weight of a propylene glycol unit and a tetramethylene glycol unit that are contained in the component (b-1) to the total weight of the component (a-1) and the component (b-1) is 30% or less.

18 Claims, 3 Drawing Sheets

(51) Int. Cl.
  *G03F 7/004* (2006.01)
  *G02B 27/01* (2006.01)
  *G03H 1/04* (2006.01)
  *C08G 18/42* (2006.01)
  *G03F 7/00* (2006.01)
  *G11B 7/2472* (2013.01)

(52) U.S. Cl.
  CPC ............. *G03H 1/02* (2013.01); *G03H 1/0402* (2013.01); *G11B 7/245* (2013.01); *G11B 7/2472* (2013.01); *G02B 2027/0174* (2013.01); *G02B 2027/0178* (2013.01); *G03H 2001/0264* (2013.01); *G03H 2001/0413* (2013.01); *G03H 2260/12* (2013.01)

(58) Field of Classification Search
  CPC .. G11B 7/245; G11B 7/2472; C08G 18/4277; G02B 2027/0178
  See application file for complete search history.

(56) References Cited

U.S. PATENT DOCUMENTS

| | | | | |
|---|---|---|---|---|
| 2009/0062419 | A1* | 3/2009 | Stockel | C08G 18/638 |
| | | | | 522/109 |
| 2010/0039685 | A1* | 2/2010 | Miki | G03H 1/02 |
| | | | | 359/3 |
| 2010/0067073 | A1* | 3/2010 | Miki | G11B 7/245 |
| | | | | 359/3 |
| 2010/0273096 | A1* | 10/2010 | Askham | G03F 7/027 |
| | | | | 430/2 |
| 2011/0092612 | A1* | 4/2011 | Miki | G11B 7/244 |
| | | | | 522/154 |
| 2014/0349218 | A1 | 11/2014 | Shimizu et al. | |
| 2017/0059759 | A1 | 3/2017 | Ayres et al. | |
| 2018/0120694 | A1 | 5/2018 | Igarashi et al. | |
| 2018/0321736 | A1* | 11/2018 | Masson | G02B 26/0833 |
| 2021/0116805 | A1* | 4/2021 | Shimizu | C08G 18/3819 |

FOREIGN PATENT DOCUMENTS

| | | |
|---|---|---|
| JP | 2009271502 A | 11/2009 |
| JP | 2013103984 A | 5/2013 |
| JP | 2014191216 A | 10/2014 |
| JP | 2016-191733 * | 11/2016 |
| JP | 2016190895 A | 11/2016 |
| JP | 2016-206488 * | 12/2016 |
| JP | 2016206488 A | 12/2016 |
| WO | WO-2016174798 A1 | 11/2016 |

OTHER PUBLICATIONS

Combined Chinese Office Action and Search Report dated May 6, 2021 in Application No. 201980034142.0 (with machine English translation of Office Action and English translation of Categories), 19 pages.

International Search Report dated Sep. 3, 2019 in PCT/JP2019/022924 (with English translation), 7 pages.

Office Action dated Nov. 30, 2021 in Chinese Patent Application No. 201980034142.0 (with English translation), 15 pages.

* cited by examiner

COMPOSITION FOR HOLOGRAPHIC RECORDING MEDIUM, CURED PRODUCT FOR HOLOGRAPHIC RECORDING MEDIUM, AND HOLOGRAPHIC RECORDING MEDIUM

TECHNICAL FIELD

The present invention related to a composition for a holographic recording medium, to a cured product for a holographic recording medium that is obtained by curing the holographic recording medium composition, and to a holographic recording medium using the holographic recording medium composition.

BACKGROUND ART

To achieve a further increase in the capacity and density of optical recording mediums, holographic optical recording mediums have been developed, in which information is recorded as a hologram by changing the refractive index of a recording layer according to the distribution of light intensity generated by light interference.

It has recently been contemplated that holographic recording mediums developed for memory applications are applied to optical element applications such as light guide plates for AR glasses (e.g., PTL 1).

In the AR glass applications, a tinted medium is not preferred because the field of view of the AR glasses is also tinted, and therefore the medium must be transparent in the visible range. It is stated in PTL 1 that a holographic recording medium AK174-200 with a thickness of 200 μm has an absorbance of 0.002 at a wavelength of 425 nm or more and an absorbance of 0.07 (85% T) at a wavelength of 405 nm. These absorbance values indicate that the medium described in PTL 1 is tinted yellow.

It is preferable that a performance indicator M/# of a holographic recording medium is as high as possible. In the optical element applications such as light guide plates for AR glasses, a higher M/# can give a larger viewing angle, less color unevenness, and improved brightness.

PTL 2 discloses, as a technique for improving M/#, a method using a composition containing a compound (e.g., TEMPOL) having both a functional group chemically bonds to a matrix and a stable nitroxyl radical group.

However, studies by the inventors have revealed that the addition of TEMPOL causes the medium to yellow with time.

As described above, the tinted medium is not preferred particularly for the AR glass light guide plate applications because the tinted medium causes the field of view of the AR glasses to be tinted. Moreover, the tinted medium is not preferred also for the memory applications in which a 405 nm laser is used to record and reproduce signals because the tinted medium causes a reduction in transfer rate due to absorption of recording/reproduction light.

In a holographic recording medium, a transmission spectrum after recording is an important indicator. In the memory applications, smaller absorption at a wavelength of 405 nm that is used for reproduction of signals is preferred because a higher signal transfer rate is obtained. In the AR glass light guide plate applications, smaller absorption in the visible range is preferred because coloration of the field of view through the AR glasses can be reduced.

An oxime ester-based photopolymerization initiator has been preferably used as a photopolymerization initiator for conventional holographic recording mediums because the sensitivity of the oxime ester-based photopolymerization initiator at a recording wavelength of 405 nm is high. In addition to the oxime ester-based photopolymerization initiator, 2,4,6-trimethylbenzoyl-diphenyl-phosphine oxide (TPO) is known as the photopolymerization initiator sensitive to a recording wavelength of 405 nm, but the sensitivity of the TPO is low. In the memory applications, low sensitivity results in a low signal recording rate. In the optical element applications such as light guide plates for AR glasses, low sensitivity disadvantageously results in vertical scattering and deterioration in takt characteristics in a holographic recording step.

One problem with the oxime ester-based initiator is that it is tinted by irradiation with light after recording. This is thought to be due to a byproduct derived from a photo decomposition product of the oxime ester-based photopolymerization initiator.

PTL 3 discloses that the use of an oxime ester-based photopolymerization initiator having a specific structure can solve the above problem.

However, it has been found, according to studies by the present inventors, that, even when the oxime ester-based photopolymerization initiator having the above-described specific structure is used, an absorption edge remains in a wavelength range of 450 nm or less after postexposure and this disadvantageously causes coloration after holographic recording. One possible cause of this is that iminyl radicals in the polymerization initiator that function during polymerization during recording and/or postexposure form a dimer.

PTL 1: U.S. Patent Application Publication No. 2017/0059759

PTL 2: U.S. Pat. No. 8,658,332

PTL 3: Japanese Unexamined Patent Application Publication No. 2016-206488

SUMMARY OF INVENTION

It is an object of the present invention to provide a holographic recording medium composition and a cured product thereof that can prevent coloration of a holographic recording medium that uses an additive such as TEMPOL having a stable nitroxyl radical group in order to improve M/#. It is another object to provide the holographic recording medium.

The present inventors have found that the coloration due to the additive such as TEMPOL that has a stable nitroxyl radical group occurs through the interaction between the nitroxyl radicals and a polyol used to form a matrix and that the coloration due to the interaction can be prevented by using a specific polyol.

It is another object of the invention to provide a holographic recording medium composition, a cured product thereof, and a holographic recording medium in which, when an oxime ester-based photopolymerization initiator is used, coloration after holographic recording is prevented.

The inventors have found that the coloration after holographic recording can be prevented by using an oxime ester-based photopolymerization initiator in combination with a stable nitroxyl radical group-containing compound. The mechanism of this effect may be that iminyl radicals are trapped by the stable nitroxyl radicals.

The present invention is summarized as follows.

[1] A holographic recording medium composition comprising components (a-1) to (e-1) below, wherein the ratio of the total weight of a propylene glycol unit and a tetramethylene glycol unit that are contained in component (b-1)

to the total weight of component (a-1) and component (b-1) is 30% by weight or less:
component (a-1): an isocyanate group-containing compound;
component (b-1): an isocyanate-reactive functional group-containing compound;
component (c-1): a polymerizable monomer;
component (d-1): a photopolymerization initiator; and
component (e-1): a stable nitroxyl radical group-containing compound.

[2] A holographic recording medium composition comprising components (a-1) to (e-1) below, wherein the ratio of the weight of a caprolactone unit contained in component (b-1) to the total weight of component (a-1) and component (b-1) is 20% by weight or more:
component (a-1): an isocyanate group-containing compound;
component (b-1): an isocyanate-reactive functional group-containing compound;
component (c-1): a polymerizable monomer;
component (d-1): a photopolymerization initiator; and
component (e-1): a stable nitroxyl radical group-containing compound.

[3] The holographic recording medium composition according to [1] or [2], wherein the photopolymerization initiator is a photopolymerization initiator containing an oxime ester-based photopolymerization initiator.

[4] The holographic recording medium composition according to [3], wherein the oxime ester-based photopolymerization initiator is a compound represented by formula (4) below:

[Chem. 1]

$$\text{(4)}$$

wherein, in formula (4), $R^{21}$ represents an alkyl group;
$R^{22}$ represents an alkyl group, an aryl group, or an aralkyl group;
$R^{23}$ represents a $-(CH_2)_m-$ group, m being an integer of 1 or more and 6 or less;
$R^{24}$ represents a hydrogen atom or any substituent; and
$R^{25}$ represents any substituent having no multiple bond conjugated with a carbonyl group bonded to $R^{25}$.

[5] The holographic recording medium composition according to [4], wherein $R^{24}$ in formula (4) represents an alkyl group, an alkoxycarbonyl group, an aromatic ring group, or a heterocyclic group, and wherein $R^{25}$ represents an alkyl group optionally having a substituent.

[6] The holographic recording medium composition according to any one of [1] to [5], wherein component (b-1) contains polycaprolactonepolyol.

[7] The holographic recording medium composition according to any one of [1] to [6], wherein the polymerizable monomer denoted as component (c-1) is a (meth)acrylic-based monomer.

[8] The holographic recording medium composition according to any one of [1] to [7], wherein the molecular weight of the polymerizable monomer denoted as component (c-1) is 300 or more.

[9] The holographic recording medium composition according to any one of [1] to [8], wherein component (e-1) is 4-hydroxy-2,2,6,6-tetramethylpiperidine-1-oxyl.

[10] The holographic recording medium composition according to any one of [1] and [3] to [9], wherein the ratio of the weight of a caprolactone unit contained in component (b-1) to the total weight of component (a-1) and component (b-1) is 20% by weight or more.

[11] The holographic recording medium composition according to any one of [1] to [9], wherein the molar ratio of component (e-1) to component (d-1) in the composition (component (e-1)/component (d-1)) is 0.1 or more and 10 or less.

[12] The holographic recording medium composition according to any one of [1] to [11], wherein the content of component (c-1) in the composition is 0.1% by weight or more and 80% by weight or less, and wherein the amount of component (d-1) relative to the amount of component (c-1) is 0.1% by weight or more and 20% by weight or less.

[13] The holographic recording medium composition according to any one of [1] to [12], wherein the total content of component (a-1) and component (b-1) in the composition is 0.1% by weight or more and 99.9% by weight or less, and wherein the ratio of the number of isocyanate-reactive functional groups contained in component (b-1) to the number of isocyanate groups contained in component (a-1) is 0.1 or more and 10.0 or less.

[14] The holographic recording medium composition according to any one of [1] to [13], further comprising component (f-1) below:
component (f-1): a curing catalyst.

[15] A cured product for a holographic recording medium, wherein the cured product is obtained by curing the holographic recording medium composition according to any one of [1] to [14].

[16] A stacked body for a holographic recording medium, the stacked body comprising: a recording layer formed from the cured product for a holographic recording medium according to [15]; and a support.

[17] A holographic recording medium obtained by exposing the cured product for a holographic recording medium according to [15] or the stacked body for a holographic recording medium according to [16] to light.

[18] The holographic recording medium according to [17], wherein the amounts of change Δx and Δy in chromaticity in a CIE XYZ color system for a 2 degree field of view from the chromaticity of a blank are 0.0040 or less, the chromaticity being measured using an illuminant C light source.

[19] The holographic recording medium according to [17] or [18], wherein the holographic recording medium is a light guide plate for AR glasses.

Advantageous Effects of Invention

According to the present invention, coloration of the holographic recording medium that uses an additive such as TEMPOL having a stable nitroxyl radical group in order to improve M/# can be prevented.

Therefore, particularly in the AR glass light guide plate applications, a field of view with no coloration can be provided while an increase in viewing angle, a reduction in color unevenness, and an improvement in brightness are achieved.

In the memory applications also, absorption of recording/reproduction light can be reduced to improve the transfer rate.

According to the present invention, the holographic recording medium that uses, as a photopolymerization initiator, the oxime ester-based photopolymerization initiator effective in improving sensitivity can be prevented from undergoing coloration after holographic recording.

Therefore, particularly in the AR glass light guide plate applications, a field of view with no coloration can be provided while high sensitivity, an increase in viewing angle, a reduction in color unevenness, and an improvement in brightness are achieved.

In the memory applications also, absorption of recording/reproduction light can be reduced to further improve the transfer rate.

DESCRIPTION OF EMBODIMENTS

Figure 1:
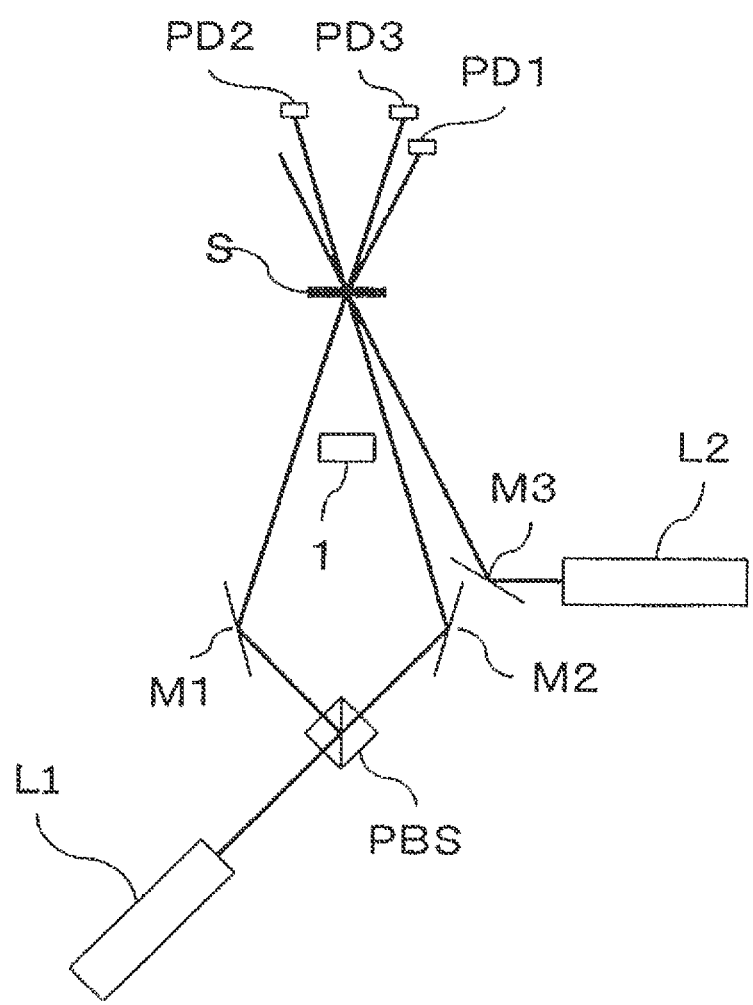
FIG. 1 is a structural diagram showing the outline of a device used for holographic recording in Examples.

Embodiments of the present invention will be described in detail. The following articles, methods, etc. are examples (representative examples) of the embodiments of the present invention, and the present invention is not limited to the features of the embodiments so long as the invention does not depart from the scope thereof.

[Holographic Recording Medium Composition]

A holographic recording medium composition according to a first embodiment of the present invention contains components (a-1) to (e-1) below. The ratio of the total weight of a propylene glycol (PG) unit and a tetramethylene glycol (TMG) unit that are contained in component (b-1) to the total weight of component (a-1) and component (b-1) (the ratio may be denoted by "(PG+TMG)/((a-1)+(b-1))") is 30% by weight or less.

A holographic recording medium composition according to a second embodiment of the present invention contains components (a-1) to (e-1) below. The ratio of the weight of a caprolactone (CL) unit contained in component (b-1) to the total weight of component (a-1) and component (b-1) (the ratio may be denoted by "(CL)/((a-1)+(b-1))") is 20% by weight or more.

component (a-1): an isocyanate group-containing compound;
component (b-1): an isocyanate-reactive functional group-containing compound;
component (c-1): a polymerizable monomer;
component (d-1): a photopolymerization initiator; and
component (e-1): a stable nitroxyl radical group-containing compound.

<Component (a-1)>

The isocyanate group-containing compound denoted as component (a-1) is preferably a component that reacts with the isocyanate-reactive functional group-containing compound (component (b-1)) in the presence of a curing catalyst (component (f-1)) described later to form a resin matrix.

An isocyanate group ratio in the molecule of the isocyanate group-containing compound is preferably 50% by weight or less, more preferably 47% by weight or less, and still more preferably 45% by weight or less. The lower limit of the isocyanate group ratio is generally 0.1% by weight and preferably 1% by weight. When the isocyanate group ratio is equal to or less than the above upper limit, a holographic recording medium to be formed is unlikely to become turbid, and optical uniformity is obtained. When the isocyanate group ratio is equal to or more than the above lower limit, the hardness and glass transition temperature of the resin matrix increase, and loss of records can be prevented.

In the present invention, the isocyanate group ratio indicates the ratio of the isocyanate group to the whole amount of the isocyanate group-containing compound used. The isocyanate group ratio in the isocyanate group-containing compound is determined from the following formula. The molecular weight of the isocyanate group is 42.

(42×the number of isocyanate groups/the molecular weight of the isocyanate group-containing compound)×100

No particular limitation is imposed on the type of isocyanate group-containing compound, and the compound may have an aromatic skeleton, an araliphatic skeleton, an aliphatic skeleton, or an alicyclic skeleton. The isocyanate group-containing compound may have in its molecule one isocyanate group or two or more isocyanate groups and has preferably two or more isocyanate groups. A recording layer having good record retainability can be obtained using a three-dimensional crosslinked matrix obtained from a compound having two or more isocyanate groups in its molecule (component (a-1)) and a compound having three or more isocyanate-reactive functional groups in its molecule (component (b-1)) or a three-dimensional crosslinked matrix obtained from a compound having three or more isocyanate groups in its molecule (component (a-1)) and a compound having two or more isocyanate-reactive functional groups in its molecule (component (b-1)).

Examples of the isocyanate group-containing compound include isocyanic acid, butyl isocyanate, octyl isocyanate, butyl diisocyanate, hexamethylene diisocyanate (HMDI), isophorone diisocyanate (IPDI), 1,8-diisocyanato-4-(isocyanatomethyl)octane, 2,2,4- and/or 2,4,4-trimethylhexamethylene diisocyanate, isomeric bis(4,4'-isocyanatocyclohexyl)methanes and mixtures thereof having any desired isomer content, isocyanatomethyl-1,8-octanediisocyanate, 1,4-cyclohexylene diisocyanate, isomeric cyclohexanedimethylene diisocyanates, 1,4-phenylene diisocyanate, 2,4- and/or 2,6-toluene diisocyanate, 1,5-naphthylene diisocyanate, 2,4'- and/or 4,4'-diphenylmethane diisocyanate and/or triphenylmethane 4,4',4"-triisocyanate.

It is also possible to use an isocyanate derivative having a urethane structure, a urea structure, a carbodiimide structure, an acrylic urea structure, an isocyanurate structure, an allophanate structure, a biuret structure, an oxadiazinetrione structure, a uretdione structure, and/or an iminooxadiazinedione structure.

Any one of them may be used alone, or any combination of two or more of them may be used at any ratio.

Among the above compounds, isocyanate group-containing aliphatic compounds and isocyanate group-containing alicyclic compounds are preferred because they resist coloration.

<Component (b-1)>

The isocyanate-reactive functional group-containing compound denoted as component (b-1) is a compound having active hydrogen (an isocyanate-reactive functional group) that is involved in a chain extension reaction with the isocyanate group-containing compound denoted as component (a-1). Examples of the isocyanate-reactive functional group include a hydroxy group, an amino group, and a mercapto group. The isocyanate-reactive functional group-containing compound may contain in its molecule one isocyanate-reactive functional group or two or more isocyanate-reactive functional groups and preferably contains two or more isocyanate-reactive functional groups. When two or more isocyanate-reactive functional groups are contained, the isocyanate-reactive functional groups contained in one molecule may be of the same type or different types.

The number average molecular weight of the isocyanate-reactive functional group-containing compound is generally 50 or more, preferably 100 or more, and more preferably 150 or more and is generally 50000 or less, 10000 or less, and more preferably 5000 or less. When the number average molecular weight of the isocyanate-reactive functional group-containing compound is equal to or more than the above lower limit, the crosslink density is low, and a reduction in recording rate can be prevented. When the number average molecular weight of the isocyanate-reactive functional group-containing compound is equal to or less than the above upper limit, its compatibility with another component increases, and the crosslink density increases, so that loss of recorded contents can be prevented.

The number average molecular weight of component (b-1) is a value measured by gel permeation chromatography (GPC).

(Hydroxy Group-Containing Compound)

A compound having a hydroxy group as the isocyanate-reactive functional group may be used. The hydroxy group-containing compound may be any compound having in its molecule at least one hydroxy group, and it is preferable that the compound has two or more hydroxy groups. Examples of such a compound include: glycols such as ethylene glycol, triethylene glycol, diethylene glycol, polyethylene glycol, propylene glycol, polypropylene glycol (PPG), and neopentyl glycol; diols such as butanediol, pentanediol, hexanediol, heptanediol, tetramethylene glycol (TMG), and polytetramethylene glycol (PTMG); bisphenols and compounds obtained by modifying these polyfunctional alcohols with a polyethyleneoxy chain or a polypropyleneoxy chain; triols such as glycerin, trimethylolpropane, butanetriol, pentanetriol, hexanetriol, and decanetriol and compounds obtained by modifying these polyfunctional alcohols with a polyethyleneoxy chain or a polypropyleneoxy chain; polyfunctional polyoxybutylenes; polyfunctional polycaprolactones; polyfunctional polyesters; polyfunctional polycarbonates; and polyfunctional polypropylene glycols. Any one of them may be used alone, or any combination of two or more of them may be used at any ratio.

The number average molecular weight of the hydroxy group-containing compound is generally 50 or more, preferably 100 or more, and more preferably 150 or more and is generally 50000 or less, 10000 or less, and more preferably 5000 or less. When the number average molecular weight of the hydroxy group-containing compound is equal to or more than the above lower limit, the crosslink density is low, and a reduction in recording rate can be prevented. When the number average molecular weight of the hydroxy group-containing compound is equal to or less than the above upper limit, its compatibility with another component is improved, and the crosslink density increases, so that loss of recorded contents can be prevented.

(Amino Group-Containing Compound)

A compound having an amino group as the isocyanate-reactive functional group may be used. The amino group-containing compound may be any compound having in its molecule at least one amino group, and it is preferable that the compound has two or more amino groups. Examples of such a compound include: aliphatic amines such as ethylenediamine, diethylenetriamine, triethylenetetramine, and hexamethylenediamine; alicyclic amines such as isophoronediamine, menthanediamine, and 4,4'-diaminodicyclohexylmethane; and aromatic amines such as m-xylylenediamine, diaminodiphenylmethane, and m-phenylenediamine. Any one of them may be used alone, or any combination of two or more of them may be used at any ratio.

The number average molecular weight of the amino group-containing compound is generally 50 or more, preferably 100 or more, and more preferably 150 or more and is generally 50000 or less, preferably 10000 or less, and more preferably 5000 or less. When the number average molecular weight of the amino group-containing compound is equal to or more than the above lower limit, the crosslink density is low, and a reduction in the recording rate can be prevented. When the number average molecular weight of the amino group-containing compound is equal to or less than the above upper limit, its compatibility with another component is improved, and the crosslink density increases, so that loss of recorded contents can be prevented.

(Mercapto Group-Containing Compound)

A compound having a mercapto group as the isocyanate-reactive functional group may be used. The mercapto group-containing compound may be any compound having in its molecule at least one mercapto group, and it is preferable that the compound has two or more mercapto groups. Examples of such a compound include 1,3-butanedithiol, 1,4-butanedithiol, 2,3-butanedithiol, 1,2-benzenedithiol, 1,3-benzenedithiol, 1,4-benzenedithiol, 1,10-decanedithiol, 1,2-ethanedithiol, 1,6-hexanedithiol, 1,9-nonanedithiol, pentaerythritol tetrakis(3-mercaptopropionate), pentaerythritol tetrakis(2-mercaptoacetate), pentaerythritol tetrakis(3-mercaptobutyrate), trimethylolpropane tris(3-mercaptopropionate), dipentaerythritol hexakis(3-mercaptopropionate), and 1,4-bis(3-mercaptobutyryloxy)butane. Any one of them may be used alone, or any combination of two or more of them may be used at any ratio.

The number average molecular weight of the mercapto group-containing compound is generally 50 or more, preferably 100 or more, and more preferably 150 or more and is generally 50000 or less, 10000 or less, and more preferably 5000 or less. When the number average molecular weight of the mercapto group-containing compound is equal to or more than the above lower limit, the crosslink density is low, and a reduction in the recording rate can be prevented. When the number average molecular weight of the mercapto group-containing compound is equal to or less than the above upper limit, its compatibility with another component is improved, and the crosslink density increases, so that loss of recorded contents can be prevented.

(Component (b-1) Preferred in the Present Invention)

The holographic recording medium composition according to the first embodiment of the present invention is characterized in that the ratio of the total weight of the PG unit and the TMG unit that are contained in component (b-1) to the total weight of component (a-1) and component (b-1) ((PG+TMG)/((a-1)+(b-1))) is 30% by weight or less.

The PG unit and the TMG unit interact with a stable nitroxyl radical group included in an additive such as TEMPOL to thereby cause coloration. Therefore, in the first embodiment, coloration is reduced by reducing the contents of these coloration inducing units. The smaller the ratio (PG+TMG)/((a-1)+(b-1)), the further the coloration can be reduced. Therefore, the ratio (PG+TMG)/((a-1)+(b-1)) in the holographic recording medium composition in the first embodiment is 30% by weight or less, particularly preferably 27% by weight or less, especially preferably 25% by weight or less, and most preferably 0% by weight (no PG unit and no TMG unit are contained).

In terms of reducing the ratio (PG+TMG)/((a-1)+(b-1)) to the above upper limit or less, it is not preferable to use polypropylene glycol (PPG) or polytetramethylene glycol (PTMG) having PG units or TMG units as component (b-1). Therefore, when a compound having PG units or TMG units is used, the compound is used such that the ratio (PG+TMG)/((a-1)+(b-1)) in the composition is equal to or less than the above upper limit.

The holographic recording medium composition according to the second embodiment of the present invention is characterized in that the ratio of the weight of the CL unit contained in component (b-1) to the total weight of component (a-1) and component (b-1), ((CL)/((a-1)+(b-1))), is 20% by weight or more.

From the viewpoint of reducing coloration, component (b-1) used is preferably polycaprolactone. When polycaprolactone is used as component (b-1), the chemical composition of the holographic recording medium composition of the present invention is designed such that the ratio (CL)/((a-1)+(b-1)) is 20% by weight or more, preferably 25% by weight or more, and more preferably 30 to 70% by weight. The CL unit is a unit (open-chain unit) derived from caprolactone contained in the polycaprolactone.

Examples of the polycaprolactone used as component (b-1) include polycaprolactonepolyols (such as polycaprolactonediol and polycaprolactonetriol) obtained by subjecting ε-caprolactone to ring-opening polymerization in the presence of a polyhydric alcohol such as ethylene glycol, diethylene glycol, triethylene glycol, propylene glycol, dipropylene glycol, 1,3-butanediol, 1,4-butanediol, hexamethylene glycol, methylpentanediol, 2,4-diethylpentanediol, neopentyl glycol, 2-ethyl-1,3-hexanediol, trimethylolpropane, ditrimethylolpropane, pentaerythritol, or dipentaerythritol or a diol such as polypropylene glycol or polytetramethylene glycol (PTMG). Any one of them may be used alone, or any combination of two or more of them may be used at any ratio.

Preferably, the holographic recording medium composition of the present invention contains any of the above-listed polycaprolactonepolyols as component (b-1). For example, it is preferable that only a polycaprolactonepolyol is used as component (b-1) or a combination of a polycaprolactonepolyol and another component (b-1) is used. Particularly preferably, only a polycaprolactonepolyol is used as component (b-1) to adjust the ratio (CL)/((a-1)+(b-1)) in the composition to the above lower limit or higher.

When the ratio (PG+TMG)/((a-1)+(b-1)) in the composition is equal to or less than the above upper limit, a polyol having a PG unit or a TMG unit such as polypropylene glycol may be modified with, for example, ε-caprolactone to produce a compound having a CL unit introduced therein, and this compound can be used as component (b-1).

<Component (c-1)>

The polymerizable monomer denoted as component (c-1) is a compound that can be polymerized using the photopolymerization initiator denoted as component (d-1) described later. Component (c-1) is a monomer compound to be polymerized during recording and/or postexposure.

No particular limitation is imposed on the type of polymerizable monomer used for the holographic recording medium composition of the present invention, and an appropriate compound can be selected from known compounds. Examples of the polymerizable monomer include cationically polymerizable monomers, anionically polymerizable monomers, and radically polymerizable monomers. Any of these monomers can be used, and two or more of them may be used in combination. Component (c-1) used is preferably a radically polymerizable monomer because the radically polymerizable monomer is unlikely to inhibit the reaction through which the isocyanate group-containing compound and the isocyanate-reactive functional group-containing compound form the matrix.

(Cationically Polymerizable Monomer)

Examples of the cationically polymerizable monomer include epoxy compounds, oxetane compounds, oxolane compounds, cyclic acetal compounds, cyclic lactone compounds, thiirane compounds, thietane compounds, vinyl ether compounds, spiro orthoester compounds, ethylenically unsaturated compounds, cyclic ether compounds, cyclic thioether compounds, and vinyl compounds. Any one of these cationically polymerizable monomers may be used alone, or any combination of two or more of them may be used at any ratio.

(Anionically Polymerizable Monomer)

Examples of the anionically polymerizable monomer include hydrocarbon monomers and polar monomers.

Examples of the hydrocarbon monomers include styrene, α-methylstyrene, butadiene, isoprene, vinylpyridine, vinylanthracene, and derivatives thereof.

Examples of the polar monomers including methacrylates, acrylates, vinyl ketones, isopropenyl ketones, and other polar monomers.

Any one of these anionically polymerizable monomers may be used alone, or any combination of two or more of them may be used at any ratio.

(Radically Polymerizable Monomer)

Examples of the radically polymerizable monomer include (meth)acryloyl group-containing compounds, (meth)acrylamides, vinyl esters, vinyl compounds, styrenes, and spiro ring-containing compounds. Any of these radically polymerizable monomers may be used alone, or any combination of two or more of them may be used at any ratio. In the present description, methacrylic and acrylic are collectively referred to as (meth)acrylic.

Among the above compounds, (meth)acryloyl group-containing compounds are preferred in terms of steric hindrance during radical polymerization.

(Molecular Weight of Polymerizable Monomer)

The molecular weight of the polymerizable monomer used for the holographic recording medium composition of the present invention is generally 80 or more, preferably 150 or more, and more preferably 300 or more and is generally 3000 or less, preferably 2500 or less, and more preferably 2000 or less. When the molecular weight is equal to or more than the above lower limit, the rate of shrinkage due to polymerization by irradiation with light during holographic data recording can be reduced. When the molecular weight is equal to or less than the above upper limit, the mobility of the polymerizable monomer in a recording layer using the holographic recording medium composition is high, and the polymerizable monomer can easily diffuse, so that sufficient diffraction efficiency can be obtained.
(Refractive Index of Polymerizable Monomer)

The refractive index of the polymerizable monomer at a wavelength of light applied to the holographic recording medium (at, for example, a recording wavelength) is generally 1.50 or more, preferably 1.52 or more, and still more preferably 1.55 or more and is generally 1.80 or less and preferably 1.78 or less. If the refractive index is excessively small, the diffraction efficiency is not sufficient, and multiplicity may not be sufficient. If the refractive index is excessively large, the difference in refractive index between the polymerizable monomer and the resin matrix is excessively large. In this case, scattering is significant, and this causes a reduction in transmittance, so that larger energy is required for recording and reproduction.

The refractive index evaluated at a shorter wavelength is larger. A sample whose refractive index is relatively high at short wavelengths exhibits a relatively high refractive index also at long wavelengths, and this relation is not reversed. It is therefore possible to predict the refractive index at the recording wavelength by evaluating the refractive index at a wavelength other than the recording wavelength.

When a sample of the polymerizable monomer is liquid, its refractive index can be measured by the minimum deviation method, the critical angle method, the V-block method, etc. When the sample is solid, the refractive index of the polymerizable monomer can be determined by dissolving the compound in an appropriate solvent to prepare a solution, measuring the refractive index of the solution, and extrapolating the refractive index to a point where the content of the compound is 100% to thereby determine the refractive index.

The polymerizable monomer having a high refractive index is preferably a compound having a halogen atom (such as iodine, chlorine, or bromine) in its molecule or a compound having a heteroatom (such as nitrogen, sulfur, or oxygen). Of these, a compound having a heterocyclic structure is more preferable.

It is preferable, in order to ensure solubility in a solvent or the matrix, that the number of heteroatoms in the heterocyclic structure included in the molecule of each of these compounds is two or less. When the number of heteroatoms in the molecule is two or less, the solubility is improved, and a uniform recording layer can be obtained. If the structural regularity of the heterocycle in the molecule is high, coloration or a reduction in solubility may occur due to stacking. Therefore, a heteroaryl group formed by condensation of two or more rings is more preferable.
(Compound i)

One preferred example of the polymerizable monomer is compound i that is a (meth)acrylic monomer described in Japanese Unexamined Patent Application Publication No. 2010-018606 and represented by the following (formula a).

[Chem. 2]

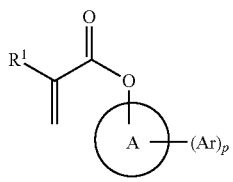

(formula a)

In (formula a), A is a ring optionally having a substituent. Ar is a (hetero)aryl group which optionally has a substituent and in which two or more rings are condensed. $R^1$ is a hydrogen atom or a methyl group. p is an integer of 1 to 7. When p is 2 or more, the plurality of Ar's may be the same or different. Suppose that A is an aromatic heterocycle and Ar is a heteroaryl group which optionally has a substituent and in which two or more rings are condensed. Then, in a structure including A and Ar connected to each other, partial structures of A and Ar that are connected directly to each other include no heteroatom.

Examples of the (meth)acrylic monomer represented by (formula a) above include 2-(1-thianthrenyl)-1-phenyl (meth)acrylate, 2-(2-benzothiophenyl)-1-phenyl (meth)acrylate, 2-(4-dibenzofuranyl)-1-phenyl (meth)acrylate, 2-(4-dibenzothiophenyl)-1-phenyl (meth) acrylate, 3-(3-benzothiophenyl)-1-phenyl (meth)acrylate, 3-(4-dibenzofuranyl)-1-phenyl (meth) acrylate, 3-(4-dibenzothiophenyl)-1-phenyl (meth)acrylate, 4-(1-thianthrenyl)-1-phenyl (meth)acrylate, 4-(4-dibenzothiophenyl)-1-phenyl (meth)acrylate, 2,4-bis(1-thianthrenyl)-1-phenyl (meth)acrylate, 2,4-bis(2-dibenzothiophenyl)-1-phenyl (meth)acrylate, 2,4-bis(3-benzothiophenyl)-1-phenyl (meth)acrylate, 2,4-bis(4-dibenzofuranyl)-1-phenyl (meth)acrylate, 2,4-bis(4-dibenzothiophenyl)-1-phenyl (meth)acrylate, 4-methyl-2,6-bis(1-thianthrenyl)-1-phenyl (meth)acrylate, 4-methyl-2,6-bis(2-benzothiophenyl)-1-phenyl (meth)acrylate, 4-methyl-2,6-bis(3-benzothiophenyl)-1-phenyl (meth)acrylate, 4-methyl-2,6-bis(4-dibenzofuranyl)-1-phenyl (meth)acrylate, and 4-methyl-2,6-bis(4-dibenzothiophenyl)-1-phenyl (meth) acrylate.

The design flexibility of these (meth)acrylic monomers used as component (c-1) is high, and they are industrially advantageous.
(Compound ii)

Another preferred example of the polymerizable monomer is compound ii described in Japanese Unexamined Patent Application Publication No. 2016-222566 and represented by at least formula (1) below.

[Chem. 3]

(1)

In formula (1), Q is a thiophene-containing ring sulfide group optionally having a substituent. G is an acryloyl or methacryloyl group. L is a direct bond or an (r+s)-valent linking group optionally having a substituent and linking Q to G. r represents an integer of 1 or more and 5 or less. s represents an integer of 1 or more and 5 or less.

Compound ii represented by formula (1) will be described.
<L in formula (1)>

L is a direct bond or any (r+s)-valent linking group optionally having a substituent and linking Q to G. To impart a high refractive index, L is preferably a group derived from a cyclic compound. To impart compatibility, L is preferably a group derived from an aliphatic compound. These structures may be combined according to the intended purpose of the material, and a linking group selected from —O—, —S—, —CO—, —COO—, and —CONH— may be present between a C—C bond.

To increase the compatibility of the compound as a whole, L is preferably an aliphatic hydrocarbon group having 2 to 18 carbon atoms and preferably 3 to 6 carbon atoms. To maintain high compatibility while the size of L with respect to the compound as a whole is maintained small, L is preferably a chain or cyclic saturated hydrocarbon group and more preferably a hydrocarbon group having a branched structure.

Examples of the linear saturated hydrocarbon group include a methylene group, an ethylene group, a n-propylene group, a cyclopropylene group, a n-butylene group, a n-pentylene group, and a n-hexylene group. Examples of the hydrocarbon group having a branched structure include an isopropylene group, an isobutylene group, a s-butylene group, a t-butylene group, a 1,1-dimethyl-n-propylene group, a 1,2-dimethyl-n-propylene group, a 2,2-dimethyl-n-propylene group, a 1-ethyl-n-propylene group, a 1-methyl-n-butylene group, a 2-methyl-n-butylene group, a 3-methyl-n-butylene group, a 1,1,2-trimethyl-n-propylene group, a 1,2,2-trimethyl-n-propylene group, a 1-ethyl-2-methyl-n-propylene group, a 1,1-dimethyl-n-butylene group, a 2,2-dimethyl-n-butylene group, a 3,3-dimethyl-n-butylene group, a 1,2-dimethyl-n-butylene group, a 1,3-dimethyl-n-butylene group, a 2,3-dimethyl-n-butylene group, a 1-ethyl-n-butylene group, a 2-ethyl-n-butylene group, a 1-methyl-n-pentylene group, a 2-methyl-n-pentylene group, a 3-methyl-n-pentylene group, and a 4-methyl-n-pentylene group. Examples of the cyclic hydrocarbon group include a cyclohexylene group and a cyclopentylene group.

To increase the overall refractive index of the compound, L is preferably a 3 to 8-membered cyclic compound and more preferably a 5 to 6-membered cyclic compound. The ring in L may have a monocyclic structure or a condensed ring structure. The number of rings forming L is 1 to 4, preferably 1 to 3, and still more preferably 1 to 2. It is not always necessary that the rings forming L have aromaticity. However, to maintain a high refractive index while the size of L with respect to the molecule as a whole is maintained small, it is preferable that L includes an unsaturated bond, and it is more preferable that L is an aromatic hydrocarbon cyclic group or an aromatic heterocyclic group. To ensure optical transparency during holographic recording and reproduction, it is preferable that coloration is small. From this point of view, L is more preferably an aromatic hydrocarbon cyclic group.

Examples of the aromatic hydrocarbon ring included in L include aromatic hydrocarbon rings having 6 to 14 carbon atoms and preferably 6 to 12 carbon atoms such as a benzene ring, an indene ring, a naphthalene ring, an azulene ring, a fluorene ring, an acenaphthylene ring, an anthracene ring, a phenanthrene ring, and a pyrene ring. From the viewpoint of avoiding coloration and ensuring solubility, L is particularly preferably an aromatic hydrocarbon ring having 6 to 10 carbon atoms such as a benzene ring or a naphthalene ring.

When the ring forming L is an aromatic heterocyclic ring, no particular limitation is imposed on the heteroatom, and an atom such as S, O, N, or P can be used. From the viewpoint of ensuring compatibility, S, O, and N atoms are preferred. From the viewpoint of avoiding coloration and ensuring solubility, the number of heteroatoms per molecule is preferably 1 to 3.

Specific examples of the aromatic heterocyclic ring forming L include aromatic heterocyclic rings having 2 to 18 carbon atoms and preferably 3 to 6 carbon atoms such as a furan ring, a thiophene ring, a pyrrole ring, an imidazole ring, a triazole ring, a pyrazole ring, a pyridine ring, a pyrimidine ring, a pyrazine ring, a triazine ring, an oxazole ring, a triazole ring, a benzofuran ring, a benzothiophene ring, an indole ring, an isoindole ring, a benzimidazole ring, a quinoline ring, an isoquinoline ring, a quinoxaline ring, a dibenzofuran ring, a dibenzothiophene ring, a carbazole ring, a thianthrene ring, a dibenzothioxane ring, a dibenzobenzothiophene ring, an oxazolidine ring, and a thiazolidine ring. To maintain a high refractive index while the size of L with respect to the compound as a whole is maintained small, a thiophene ring, a furan ring, and a pyrrole ring are preferred.

<Substituent Optionally included in L>

L may further have a substituent. For example, in order to improve the solubility, L may have a substituent such as an alkyl group, an alkoxy group, an alkoxyalkyl group, an alkoxycarbonyl group, an alkoxyalkoxy group, or an alkanoyloxy group. To increase the refractive index, L may have an aryl group, an alkylthio group, an alkylthioalkyl group, an aryloxy group, or an arylalkoxy group. To achieve economical synthesis, L is preferably unsubstituted.

The alkyl group is preferably a chain alkyl group having 1 to 4 carbon atoms, and specific examples thereof include a methyl group, an ethyl group, a n-propyl group, an isopropyl group, a s-butyl group, an isobutyl group, and a s-butyl group.

The alkoxy group is preferably an alkoxy group having 1 to 4 carbon atoms, and specific examples thereof include a methoxy group and an ethoxy group.

The alkoxyalkyl group is preferably an alkoxyalkyl group having 2 to 6 carbon atoms, and specific examples thereof include a methoxymethyl group, an ethoxymethyl group, a propoxymethyl group, a butoxymethyl group, a methoxyethyl group, an ethoxyethyl group, a propoxyethyl group, and a butoxyethyl group.

The alkoxycarbonyl group is preferably an alkoxycarbonyl group having 2 to 5 carbon atoms, and specific examples thereof include a methoxycarbonyl group, an ethoxycarbonyl group, a propoxycarbonyl group, and a butoxycarbonyl group.

The alkoxyalkoxy group is preferably an alkoxyalkoxy group having 3 to 6 carbon atoms, and specific examples thereof include a methoxyethoxy group, an ethoxyethoxy group, a propoxyethoxy group, and a butoxyethoxy group.

The alkanoyloxy group is preferably an alkanoyloxy group having 2 to 5 carbon atoms, and specific examples thereof include an acetoxy group, a propionoxy group, a butyloxy group, and a valeroxy group.

The aryl group is preferably a monocyclic or condensed polycyclic aryl group having 6 to 14 carbon atoms, and specific examples thereof include a phenyl group, a naphthyl group, and an anthranyl group.

The alkylthio group is preferably an alkylthio group having 2 to 4 carbon atoms, and specific examples thereof include a methylthio group, an ethylthio group, a n-propylthio group, and an isopropylthio group.

The alkylthioalkyl group is preferably an alkylthioalkyl group having 2 to 4 carbon atoms, and specific examples thereof include a methylthiomethyl group, a methylthioethyl group, an ethylthiomethyl group, and an ethylthioethyl group.

The aryloxy group is a monocyclic or condensed polycyclic aryloxy group having 6 to 14 carbon atoms, and specific examples thereof include a phenoxy group.

The arylalkoxy group is an arylalkoxy group having 7 to 5 carbon atoms, and specific examples thereof include a benzyloxy group.

<Q in formula (1)>

Q is a thiophene-containing ring sulfide group optionally having a substituent and is preferably a thiophene-containing ring sulfide group represented by the following formula (2) or (3).

[Chem. 4]

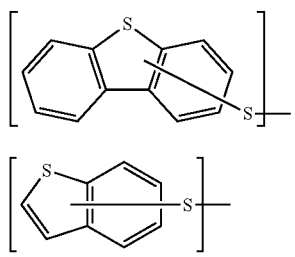

In formulas (2) and (3), the sulfide group may be bonded to any position in the thiophene-containing ring. Q is a group essential for increasing the refractive index of the compound represented by formula (1), and it is preferable that Q itself has a structure with a high refractive index.

The refractive index of Q itself can be estimated by the group contribution method. The refractive index of a compound can be estimated as follows. For each of the atomic groups forming the compound, its molecular refraction [R] and its molar volume $V_0$ are used to compute $n=\{(1+2[R]/V_0)/(1-[R]/V_0)\}^{0.5}$. Then the n's are summed up.

In applications requiring transparency, Q is more preferably the dibenzothiophene ring represented by formula (2) because its light absorption wavelength is on a shorter wavelength side and coloration by visible light is small.

It is preferable that the molecular weight of Q is somewhat large in order to reduce the rate of shrinkage due to crosslinking during irradiation with light. The molecular weight of the moiety Q is generally 50 or more and preferably 70 or more. From the viewpoint of ensuring the mobility during optical recording, the molecular weight of the moiety Q is generally 300 or less and preferably 250 or less.

<Substituent Optionally included in Q>

Q may optionally have a substituent. No particular limitation is imposed on the substituent optionally included in Q so long as it does not cause a reduction in compatibility and a reduction in refractive index. Specific examples of such a substituent include alkylthio groups having 1 to 3 carbon atoms such as a methylthio group and alkylthioalkyl groups having 2 to 6 carbon atoms such as a methylthiomethyl group.

<G in Formula (1)>

G represents an acryloyl group or a methacryloyl group.

<Bonding Position of Q to L>

Supposes that L is a cyclic group. Then, when r is 1, a preferred substitution position of Q on L is arbitrary. When r is 2 or more, it is preferable that Qs are not adjacent to each other because a high synthesis yield is obtained.

Suppose that L is a heteroaryl ring group. It is preferable that, in a structure in which L and Q are bonded to each other, partial structures of L and Q that are bonded directly to each other contain no heteroatom. In other words, it is preferable that, in the structure in which L and Q are bonded to each other, heteroatom-containing partial structures of L and Q are not bonded directly to each other. A structure in which the heteroatom-containing partial structures of L and Q are bonded directly to each other is not preferred because the structure tends to exhibit absorption in the visible range and it is highly possible that the resulting coloration interferes with light transmission during recording and reproduction.

<r and s> r is an integer of 1 or more and 5 or less. When r is 2 or more, the plurality of Qs may be the same or different. To obtain good compatibility with a solvent and the matrix, r is preferably 1 to 3 and more preferably 2 or 3.

s represents an integer of 1 or more and 5 or less. To reduce shrinkage due to photocuring, s is preferably 1.

<Exemplary Compounds>

Specific examples of compound ii are exemplified below. However, compound ii is not limited to the compounds exemplified below.

[Chem. 5]

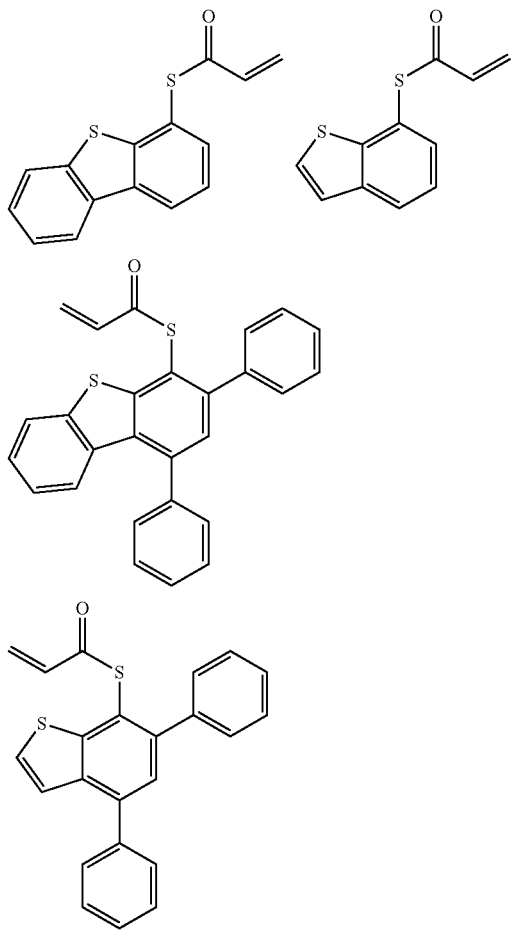

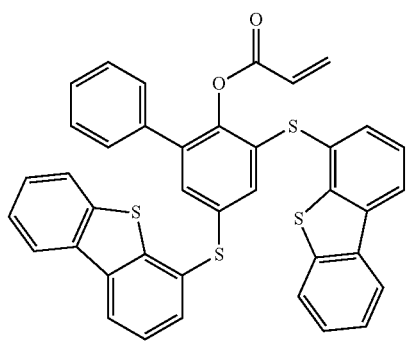

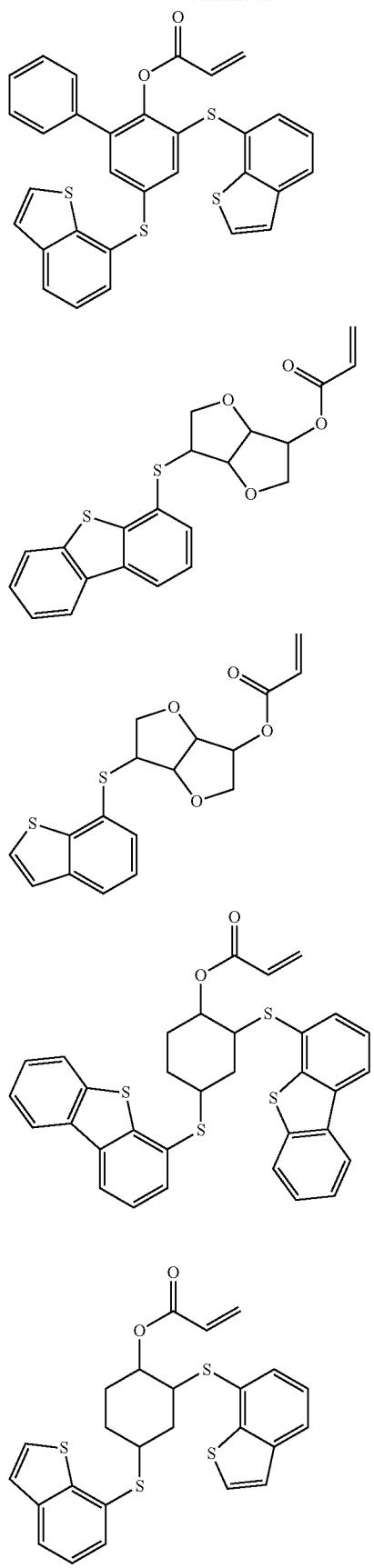
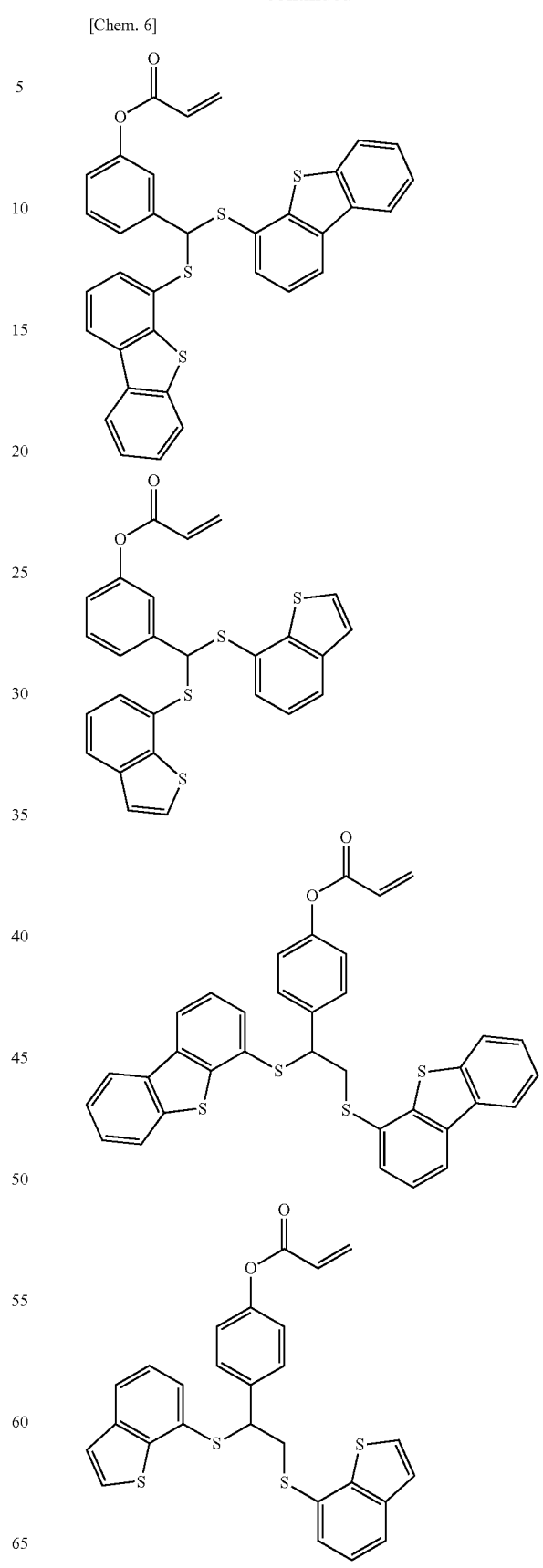

-continued

[Chem. 7]

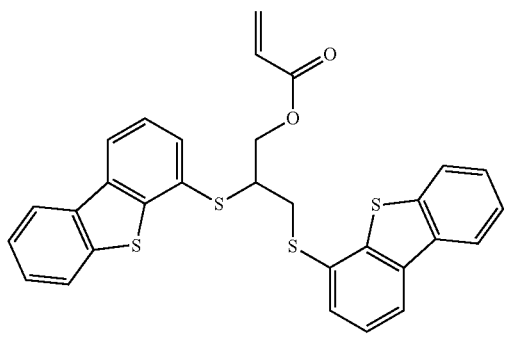

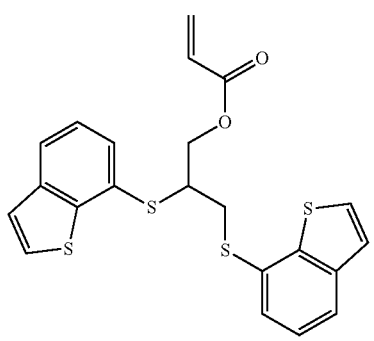

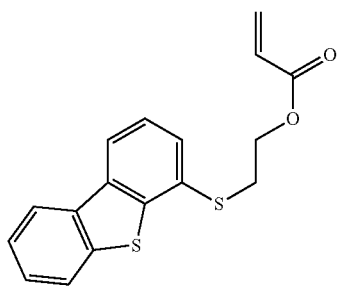

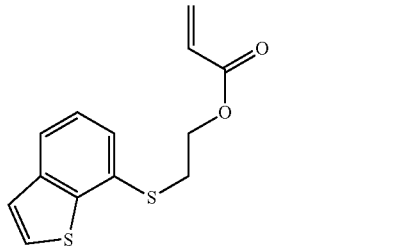

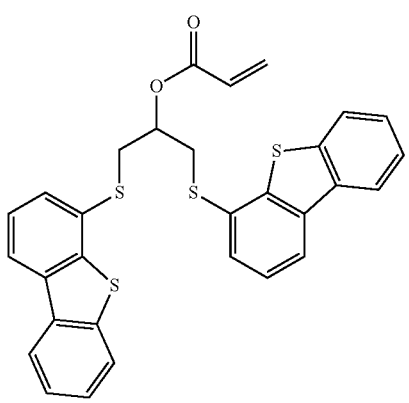

-continued

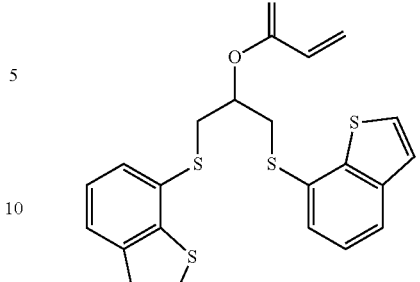

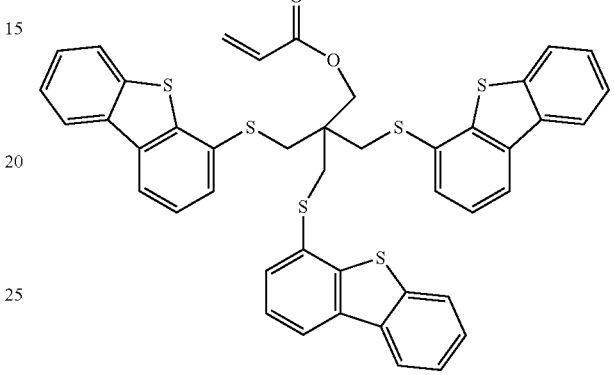

As shown by the above structural formulas, examples of the compound ii include S-4-dibenzothiophenyl thioacrylate, S-7-benzothiophenyl thioacrylate, S-(1,3-diphenyl)-4-dibenzothiophenyl thioacrylate, S-(1,3-diphenyl)-7-benzothiophenyl thioacrylate, 6-phenyl-2,4-bis(4-dibenzothiophenyl)-1-phenyl acrylate, 6-phenyl-2,4-bis(7-benzothiophenyl)-1-phenyl acrylate, 7-(3-(4-dibenzothiophenyl)-2,6-dioxa-[3,3,0]bicyclooctyl) acrylate, 7-(3-(7-benzothiophenyl)-2,6-dioxa-[3,3,0]bicyclooctyl) acrylate, 2,4-bis(4-dibenzothiophenyl)-1-cyclohexyl acrylate, 2,4-bis(7-benzothiophenyl)-1-cyclohexyl acrylate, 3,3-bis(4-dibenzothiophenylthio)methylphenyl acrylate, 3,3-bis(7-benzothiophenylthio)methylphenyl acrylate, 4-(1,2-bis(4-dibenzothiophenylthio)ethylphenyl acrylate, 4-(1,2-bis(7-benzothiophenylthio)ethylphenyl acrylate, 2,3-bis(4-dibenzothiophenylthio) propyl acrylate, 2,3-bis(7-benzothiophenylthio)propyl acrylate, 2-(4-dibenzothiophenylthio)ethyl acrylate, 2-(7-benzothiophenylthio)ethyl acrylate, 1,3-bis(4-dibenzothiophenylthio)-2-propyl acrylate, 1,3-bis(7-benzothiophenylthio)-2-propyl acrylate, and 2,2-bis(4-dibenzothiophenylthiomethyl)-3-(4-dibenzothiophenylthio) propyl acrylate.

The holographic recording medium composition of the present invention may contain, as component (c-1), only one of compound i and compound ii or two or more of them.

(Molar Absorption Coefficient of Polymerizable Monomer)

Preferably, the molar absorption coefficient of the polymerizable monomer at the holographic recording wavelength is 100 L·mol$^{-1}$·cm$^{-1}$ or less. When the molar absorption coefficient is 100 L·mol$^{-1}$·cm$^{-1}$ or less, a reduction in the transmittance of the medium is prevented, and sufficient diffraction efficiency per thickness can be obtained.

<Component (d-1)>

The photopolymerization initiator generates cations, anions, or radicals under light to initiate a chemical reaction and contributes to polymerization of the above-described polymerizable monomer. No particular limitation is imposed on the type of photopolymerization initiator, and an appropriate photopolymerization initiator may be selected according to the type of polymerizable monomer.

The photopolymerization initiator used may be an oxime ester-based photopolymerization initiator exemplified below or an additional photopolymerization initiator other than the oxime ester-based photopolymerization initiator. It is preferable to use at least one or more oxime ester-based photopolymerization initiators.

In this case, the oxime ester-based photopolymerization initiator is used in an amount of preferably 0.003% by weight or more, more preferably 0.03% by weight or more, still more preferably 0.05% by weight or more, and particularly preferably 0.1 to 100% by weight based on the total amount of the photopolymerization initiators.

Examples of the additional photopolymerization initiator include cationic photopolymerization initiators described later, anionic photopolymerization initiators described later, and radical photopolymerization initiators described later. Among these additional photopolymerization initiators, radical photopolymerization initiators are preferably used because the matrix forming reaction is unlikely to be inhibited. In particular, a phosphine oxide compound is more preferred.

The photopolymerization initiator is more preferably a compound having a molar absorption coefficient at the recording wavelength of 1000 L·mol$^{-1}$·cm$^{-1}$ or less. When the molar absorption coefficient is 1000 L·mol$^{-1}$·cm$^{-1}$ or less, a reduction in transmittance of the holographic recording medium at the recording wavelength that occurs when the photopolymerization initiator is mixed in an amount enough to obtain sufficient diffraction efficiency can be prevented.

(Oxime Ester-Based Photopolymerization Initiator)

It is only necessary that the oxime ester-based photopolymerization initiator have —C=N—O— in part of its structure. In particular, a compound represented by (formula d) or (formula f) is preferred because good recording sensitivity is obtained.

[Chem. 8]

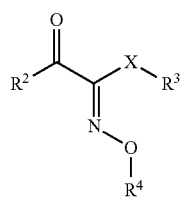

(formula d)

In (formula d), X represents: a single bond; or a divalent group selected from the group consisting of an alkylene group having 1 to 20 carbon atoms and optionally having a substituent, an alkenylene group —(CH=CH)$_n$— optionally having a substituent, an alkynylene group —(C≡C)$_n$— optionally having a substituent, and combinations thereof (n is an integer of 1 or more and 5 or less).

$R^2$ represents a monovalent organic group having an aromatic ring and/or a heteroaromatic ring.

$R^3$ represents a hydrogen atom or a group selected from the group consisting of an alkylthio group having 1 to 12 carbon atoms, an alkoxycarbonyl group having 2 to 12 carbon atoms, an alkenyloxycarbonyl group having 3 to 12 carbon atoms, an alkynyloxycarbonyl group having 3 to 12 carbon atoms, an aryloxycarbonyl group having 7 to 12 carbon atoms, a heteroaryloxycarbonyl group having 3 to 12 carbon atoms, an alkylthiocarbonyl group having 2 to 12 carbon atoms, an alkenylthiocarbonyl group having 3 to 12 carbon atoms, an alkynylthiocarbonyl group having 3 to 12 carbon atoms, an arylthiocarbonyl group having 7 to 12 carbon atoms, a heteroarylthiocarbonyl group having 3 to 12 carbon atoms, an alkylthioalkoxy group, —O—N=CR$^{32}$R$^{33}$, —N(OR$^{34}$)—CO—R$^{35}$, and a group represented by (formula e) below (R$^{32}$ and R$^{33}$ each represent an optionally substituted alkyl group having 1 to 12 carbon atoms and may be different from each other, and R$^{34}$ and R$^{35}$ each represent an optionally substituted alkyl group having 1 to 12 carbon atoms and may be different from each other), each of these groups optionally having a substituent.

[Chem. 9]

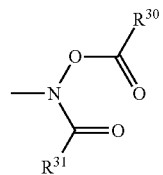

(formula e)

In (formula e), R$^{30}$ and R$^{31}$ each independently represent an optionally substituted alkyl group having 1 to 12 carbon atoms.

R$^4$ represents a group selected from the group consisting of an optionally substituted alkanoyl group having 2 to 12 carbon atoms, an optionally substituted alkenoyl group having 3 to 25 carbon atoms, an optionally substituted cycloalkanoyl group having 3 to 8 carbon atoms, an optionally substituted aryloyl group having 7 to 20 carbon atoms, an optionally substituted heteroaryloyl group having 3 to 20 carbon atoms, an optionally substituted alkoxycarbonyl group having 2 to 10 carbon atoms, and an optionally substituted aryloxycarbonyl group having 7 to 20 carbon atoms.

[Chem. 10]

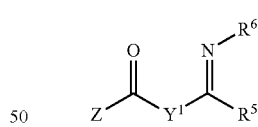

(formula f)

In (formula f), R$^5$ represents a hydrogen atom, an alkyl group having 1 to 20 carbon atoms and optionally having a substituent, an alkenyl group having 2 to 25 carbon atoms and optionally having a substituent, a heteroaryl group having 3 to 20 carbon atoms and optionally having a substituent, a heteroarylalkyl group having 4 to 25 carbon atoms and optionally having a substituent, or a group bonded to Y$^1$ or Z to form a ring.

R$^6$ represents an alkanoyl group having 2 to 20 carbon atoms, an alkenoyl group having 3 to 25 carbon atoms, a cycloalkanoyl group having 4 to 8 carbon atoms, an aryloyl group having 7 to 20 carbon atoms, an alkoxycarbonyl group having 2 to 10 carbon atoms, an aryloxycarbonyl group having 7 to 20 carbon atoms, a heteroaryl group having 2 to 20 carbon atoms, a heteroaryloyl group having 3 to 20 carbon atoms, or an alkylaminocarbonyl group having 2 to 20 carbon atoms, each of these groups optionally having a substituent.

$Y^1$ represents a divalent aromatic hydrocarbon group and/or a divalent heteroaromatic group optionally having a substituent and formed by condensation of two or more rings.

Z represents an aromatic group optionally having a substituent.

Specific examples of the oxime ester-based photopolymerization initiator include 1-(9-ethyl-6-(2-methylbenzoyl)-9H-carbazol-3-yl)-1-(O-benzoyloxime)glutaric acid methyl ester, 1-(9-ethyl-6-cyclohexanoyl-9H-carbazol-3-yl)-1-(O-acetyloxime)glutaric acid methyl ester, 1-(9-ethyl-6-diphenylamino-9H-carbazol-3-yl)-1-(O-acetyloxime)hexane, 1-(9-ethyl-6-(2-methylbenzoyl)-9H-carbazol-3-yl)-1-(O-acetyloxime)ethanone, 1-(9-ethyl-6-benzoyl-9H-carbazol-3-yl)-1-(O-acetyloxime)ethanone, 1-(9-ethyl-6-(2-methylbenzoyl)-9H-carbazol-3-yl)-1-(O-chloroacetyloxime) glutaric acid methyl ester, 1-(9-ethyl-9H-carbazol-3-yl)-1-(O-acetyloxime)-3,3-dimethylbutane acid, 1-(9-ethyl-6-(2-methylbenzoyl)-9H-carbazol-3-yl)-1-(O-acetyloxime) glutaric acid ethyl ester, 1-(4-(phenylthio)-2-(O-benzoyloxime))-1,2-octanedione, and compounds described in Japanese Unexamined Patent Application Publication No. 2010-8713 and Japanese Unexamined Patent Application Publication No. 2009-271502.

Among the compounds represented by (formula d) and (formula f) above, compounds having a ketoxime structure are more preferred.

(Preferred Oxime Ester-Based Photopolymerization Initiators)

Among the above oxime ester-based photopolymerization initiators, a compound represented by formula (4) below (hereinafter may be referred to as "compound (4)") is particularly preferably used.

[Chem. 11]

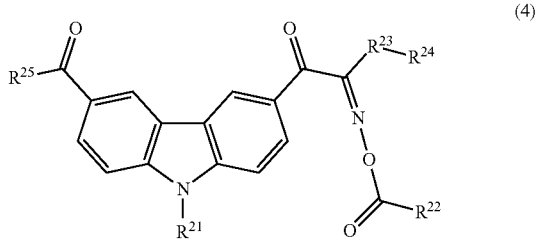

(4)

In formula (4), $R^{21}$ represents an alkyl group. $R^{22}$ represents an alkyl group, an aryl group, or an aralkyl group. $R^{23}$ represents a —$(CH_2)_m$— group. m represents an integer of 1 or more and 6 or less. $R^{24}$ represents a hydrogen atom or any substituent. $R^{25}$ represents any substituent having no multiple bond conjugated with a carbonyl group bonded to $R^{25}$.

$R^{25}$ in formula (4) has a structure that is not conjugated with a carbonyl group, and therefore one advantage of compound (4) is that a reduction in transmittance does not occur even when the holographic recording medium is irradiated with light after recording. Other advantages of compound (4) are that, even after repetitions of reproduction, the transfer rate of the holographic recording medium used as a memory is not reduced and that, even when the holographic recording medium is used outdoors for light guide plates for AR glasses, no coloration occurs.

The groups included in formula (4) will be described in detail.

<$R^{21}$>

$R^{21}$ represents an alkyl group. If $R^{21}$ is a group such as an aromatic ring group other than alkyl groups, the $sp^2$ characteristics of a nitrogen atom bonded to $R^{21}$ increase, and therefore conjugation from the carbazole ring in formula (4) to $R^{21}$ is extended, so that light emission from a decomposed product after light irradiation occurs. Therefore, $R^{21}$ is preferably an alkyl group having no conjugated system.

Examples of the alkyl group denoted as $R^{21}$ include linear, branched, and cyclic alkyl groups such as a methyl group, an ethyl group, a propyl group, an isopropyl group, a cyclopropyl group, a butyl group, an isobutyl group, a sec-butyl group, a tert-butyl group, a pentyl group, a cyclopentyl group, a hexyl group, a cyclohexyl group, a heptyl group, an octyl group, a 2-ethylhexyl group, a 3,5,5-trimethylhexyl group, a decyl group, a dodecyl group, a cyclopropyl group, a cyclobutyl group, a cyclopentyl group, a cyclohexyl group, a cyclopropylmethyl group, a cyclohexylmethyl group, and a 4-butylmethylcyclohexyl group. In these alkyl groups, the number of carbon atoms is preferably 1 or more and more preferably 2 or more and is preferably 18 or less and more preferably 8 or less. In particular, a linear alkyl group having 1 to 4 carbon atoms is preferred in terms of the crystallinity of compound (4).

The alkyl group denoted as $R^{21}$ optionally has a substituent. Examples of the optional substituent include alkoxy groups, dialkylamino groups, halogen atoms, aromatic ring groups, and heterocyclic groups. Of these, alkoxy groups are preferred in terms of the ease of adjusting the solubility of the compound.

Examples of the preferred alkoxy groups include a methoxy group, an ethoxy group, a n-propoxy group, an isopropoxy group, a cyclopentyl group, and a cyclohexyl group.

An alkyl group substituted with a fluorine atom has increased water repellency and is preferred in terms of improvement in the water resistance of the compound.

<$R^{22}$>

$R^{22}$ represents an alkyl group, an aryl group, or an aralkyl group. $R^{22}$ is a radical site to be generated when the photopolymerization initiator is irradiated with light and is preferably an alkyl group having a small molecular weight from the viewpoint of the mobility of the radical in the holographic recording medium composition.

Specific examples of the alkyl group denoted as $R^{22}$ are the same as those described above for $R^{21}$, and specific examples of the optional substituent for $R^{22}$ are also the same as those described for $R^{21}$. In these alkyl groups, the number of carbon atoms is preferably 1 or more and 4 or less and more preferably 2 or less in terms of the mobility of radicals.

From the viewpoint of improving the water resistance of compound (4), $R^{22}$ is preferably an aryl group.

Specific examples of the aryl group denoted as $R^{22}$ include a phenyl group, a naphthyl group, an anthryl group, and an indenyl group. From the viewpoint of mobility of radicals, a phenyl group is preferred.

Specific examples of the aralkyl group denoted as $R^{22}$ include a benzyl group, a phenethyl group, and a naphthylmethyl group. Radicals such as benzyl and naphthylmethyl are preferred because unique reactivity is expected.

Examples of a substituent on the aryl group denoted as $R^{22}$ or on the aryl moiety of the aralkyl group denoted as $R^{22}$ include alkyl groups, halogen atoms, and alkoxy groups. From the viewpoint of the mobility of radicals, $R^{22}$ is preferably unsubstituted.

<$R^{23}$ and m>

$R^{23}$ represents a —$(CH_2)_m$— group. When $R^{23}$ is a substituent conjugatable with the carbazole ring in formula (4), the conjugation from the carbazole ring is extended to $R^{23}$, so that the absorption wavelength of the photopolymerization initiator is shifted to the longer wavelength side. Therefore, $R^{23}$ is preferably the —$(CH_2)_m$— group having no conjugated system.

m represents an integer of 1 or more and 6 or less. In particular, m is preferably 2 or more and 4 or less. When m is in the above preferred range, the electronical effect of substituent $R^{24}$ on $R^{23}$ tends to be easily reflected.

<$R^{24}$>

$R^{24}$ represents a hydrogen atom or any substituent. No particular limitation is imposed on the above substituent so long as the effects of the invention are not impaired. Example of the substituent include alkyl groups, alkoxycarbonyl groups, monoalkylaminocarbonyl groups, dialkylaminocarbonyl groups, aromatic ring groups, and heterocyclic groups.

Of these, $R^{24}$ is preferably an alkyl group, an alkoxycarbonyl group, an aromatic ring group, or a heterocyclic group in terms of availability of raw materials and ease of synthesis. $R^{24}$ is particularly preferably an alkoxycarbonyl group in terms of obtaining an electronic effect.

Specific examples of the alkyl group denoted as $R^{24}$ are the same as those described for $R^{21}$, and specific example of the optional substituent for $R^{24}$ are the same as those described for $R^{21}$. In these groups, the number of carbon atoms is preferably 1 or more and 8 or less and more preferably 4 or less in terms of adjusting the solubility of the compound.

Examples of the alkoxycarbonyl group denoted as $R^{24}$ include a methoxycarbonyl group, an ethoxycarbonyl group, and an isopropoxycarbonyl group. The number of carbon atoms in the alkoxycarbonyl group is preferably 2 or more and 19 or less and more preferably 7 or less in terms of adjusting the solubility of the compound.

The alkoxycarbonyl group optionally has a substituent. Examples of the optional substituent include alkoxy groups, dialkylamino groups, and halogen atoms. Of these, alkoxy groups are preferred in terms of ease of adjusting the solubility.

Specific examples of the alkyl group moieties of the monoalkylaminocarbonyl and dialkylaminocarbonyl groups denoted as $R^{24}$ are the same as those described above for the alkyl group denoted as $R^{21}$, and specific example of the optional substituent for $R^{24}$ are the same as those described for $R^{21}$. In particular, the number of carbon atoms in the alkyl group moiety bonded to the amino group is preferably 1 or more and 8 or less and more preferably 4 or less. When the number of carbon atoms in the alkyl group moiety bonded to the amino group is within the above preferred range, solubility tends to be obtained.

Examples of the aromatic ring group denoted as $R^{24}$ include monocyclic rings and condensed rings such as a phenyl group, a naphthyl group, and an anthryl group. In these aromatic ring groups, the number of carbon atoms is 6 or more and is preferably 20 or less and more preferably 10 or less in terms of the solubility of the compound.

The aromatic ring group optionally has a substituent. Examples of the optional substituent include alkyl groups, alkoxy groups, dialkylamino groups, and halogen atoms. Of these, alkyl groups are preferred in terms of ease of adjusting the solubility.

Preferred examples of the alkyl group include a methyl group, an ethyl group, an isopropyl group, a cyclohexyl group, an isobutyl group, a 2-ethylhexyl group, and a n-octyl group.

The heterocyclic group denoted as $R^{24}$ is preferably a group having at least a heterocyclic structure having 1 or more heteroatoms in its ring. No particular limitation is imposed on the heteroatoms included in the heterocyclic group, and the heteroatoms may be atoms such as S, O, N, and P. In terms of availability of raw materials and ease of synthesis, atoms such as S, O, and N are preferred.

Specific examples of the heterocyclic group denoted as $R^{24}$ include monocyclic rings and condensed rings such as a thienyl group, a furyl group, a pyranyl group, a pyrrolyl group, a pyridyl group, a pyrazolyl group, a thiazolyl group, a thiadiazolyl group, a quinolyl group, a dibenzothiophenyl group, and a benzothiazolyl group. In these heterocyclic groups, the number of carbon atoms is 1 or more and more preferably 2 or more and is preferably 10 or less and more preferably 5 or less in terms of availability of raw materials and ease of synthesis.

The heterocyclic group optionally has a substituent. Examples of the optional substituent include alkyl groups, alkoxy groups, dialkylamino groups, and halogen atoms. Of these, alkyl groups are preferred in terms of ease of adjusting the solubility.

Preferred examples of the alkyl group include a methyl group, an ethyl group, an isopropyl group, a cyclohexyl group, an isobutyl group, a 2-ethylhexyl group, and a n-octyl group.

<$R^{25}$>

$R^{25}$ represents any substituent that does not have a multiple bond conjugated with the carbonyl group bonded to $R^{25}$. When such a substituent is used, no conjugated system extends beyond the carbazole ring. In this case, the length of the conjugated system in a decomposition product generated after light irradiation is not extended, so that the absorption wavelength of the decomposition product is not shifted to the long wavelength side. Therefore, an absorption reducing effect after recording is obtained.

Example of $R^{25}$ include alkyl groups, alkoxy groups, dialkylamino groups, alkylsulfonyl groups, and dialkylaminosulfonyl groups. Of these, alkyl groups are preferred in terms of the stability of the compound.

Specific examples of the alkyl group denoted as $R^{25}$ are the same as those described for $R^{21}$, and specific example of the optional substituent for $R^{25}$ are the same as those described for $R^{21}$. In terms of ease of production of the compound, the alkyl group is preferably branched, and the number of carbon atoms thereof is preferably 1 or more and more preferably 2 or more and is preferably 18 or less and more preferably 10 or less. Particularly preferred specific examples include a cyclopropyl group, a cyclobutyl group, a cyclopentyl group, a cyclohexyl group, a cycloheptyl group, an isopropyl group, a tert-butyl group, an adamantyl group, and a 1-ethylpentyl group.

Specific examples of the alkyl moieties of the alkoxy, dialkylamino, alkylsulfonyl, and dialkylaminosulfonyl groups denoted as $R^{25}$ are the same as those described for $R^{21}$, and specific example of the optional substituent for $R^{25}$ are the same as those described for $R^{21}$. In particular, the number of carbon atoms is preferably 3 or more and 18 or less and more preferably 8 or less in terms of the crystallinity of the compound.

The absorption wavelength range of compound (4) is preferably 340 nm or more and more preferably 350 nm or more and is preferably 700 nm or less and more preferably 650 nm or less. For example, when the light source is a blue laser, it is preferable that compound (4) has absorption in at least 350 to 430 nm. When a green laser is used, it is preferable that compound (4) has absorption in at least 500 to 550 nm. When the absorption wavelength range differs from the above range, it is difficult to use the energy of the irradiation light efficiently for the photopolymerization reaction, and therefore, the sensitivity tends to decrease.

The molar absorption coefficient of compound (4) at the holographic recording wavelength is preferably 10 L·mol$^{-1}$·cm$^{-1}$ or more and more preferably 50 L·mol$^{-1}$·cm$^{-1}$ or more. The molar absorption coefficient is preferably 20000 L·mol$^{-1}$·cm$^{-1}$ or less and more preferably 10000 L·mol$^{-1}$·cm$^{-1}$ or less. When the molar absorption coefficient is within the above range, effective recording sensitivity can be obtained, and an excessive reduction in the transmittance of the medium can be prevented, so that sufficient diffraction efficiency per thickness tends to be obtained.

The solubility of compound (4) in component (a-1) and component (b-1) under the conditions of 25° C. and 1 atm is preferably 0.01% by weight or more and more preferably 0.1% by weight or more.

Among commonly used oxime ester-based initiators, initiators having the above-described absorption maximum often have poor solubility in materials forming components (a-1) and (b-1) such as isocyanates and polyols and in component (c-1) such as (meth)acrylates. However, compound (4) has good solubility in components (a-1) to (c-1) such as isocyanates, polyols, and (meth)acrylates and therefore can be preferably used for the holographic recording medium composition.

Specific examples of the photopolymerization initiator represented by compound (4) are shown below but are not limited thereto.

[Chem. 12]

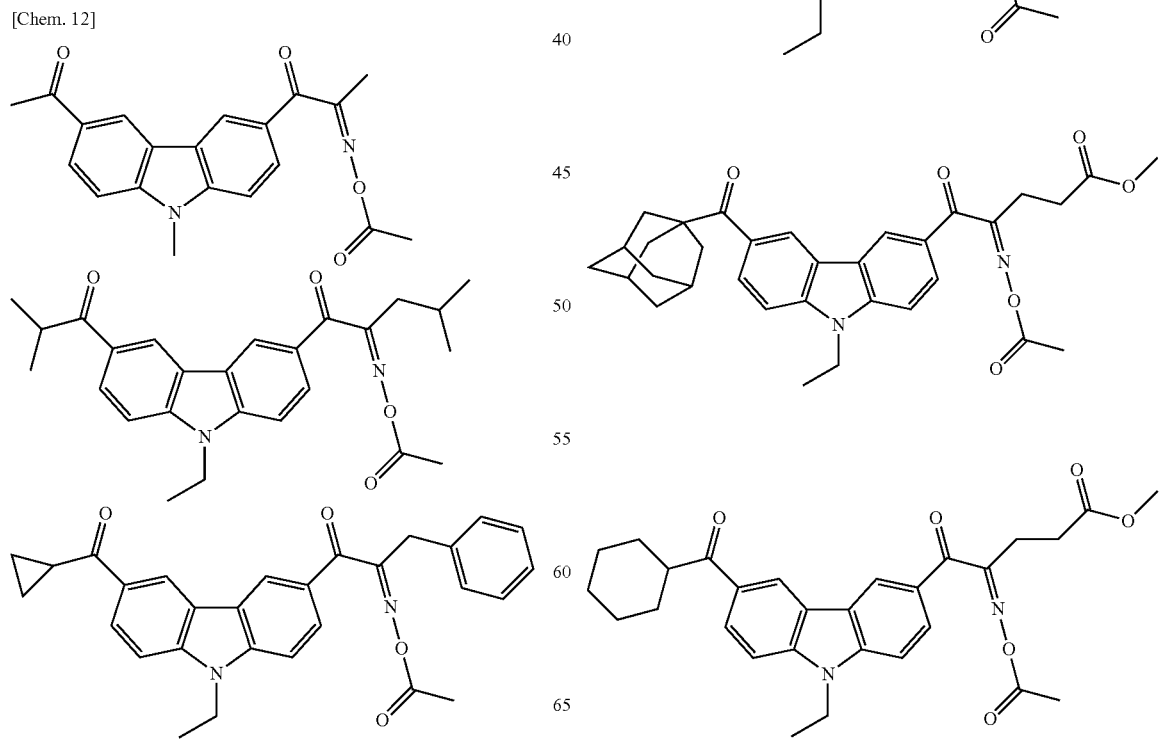

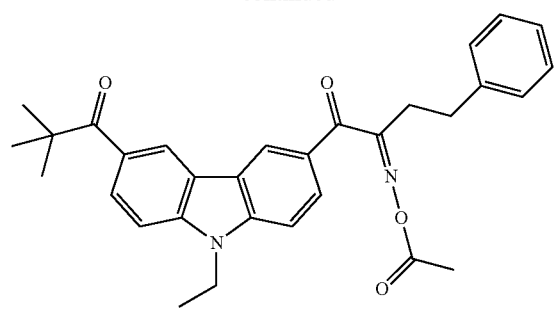
[Chem. 13]
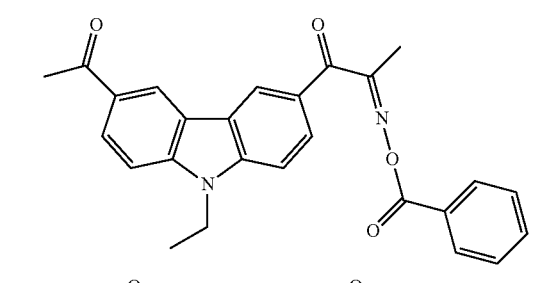
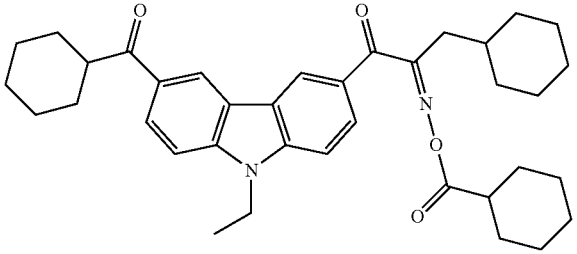
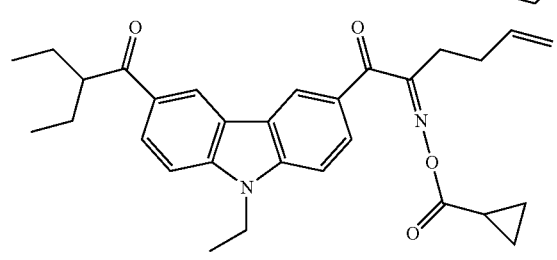
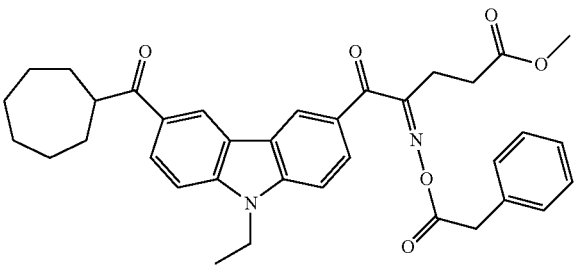
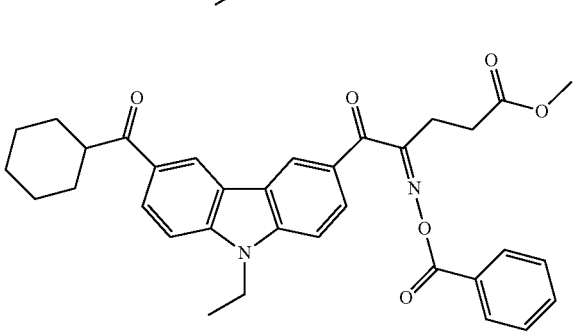
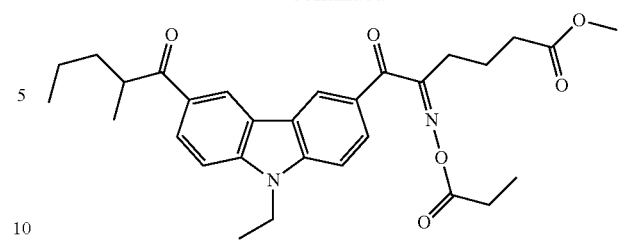
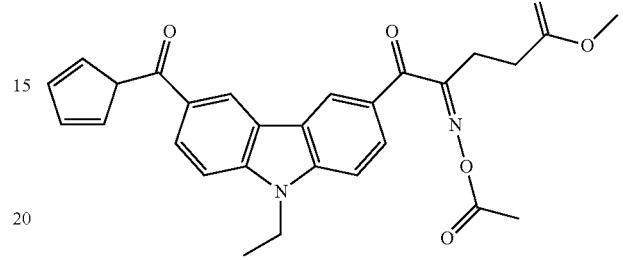
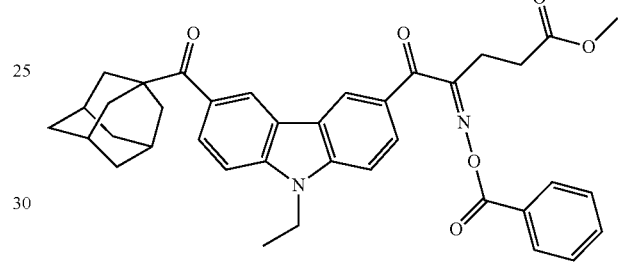
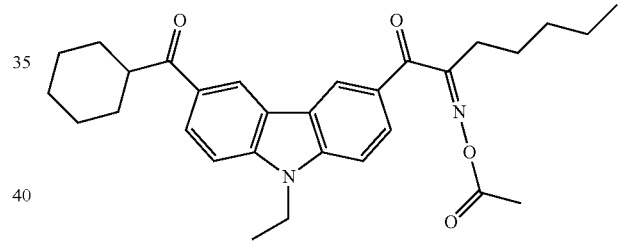
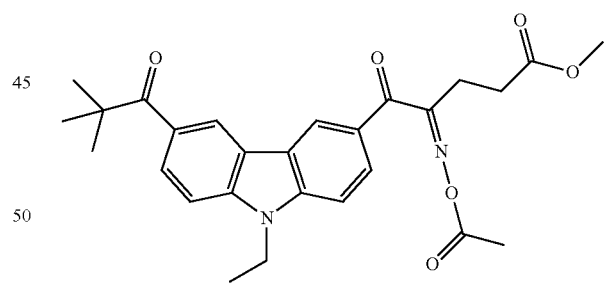
[Chem. 14]
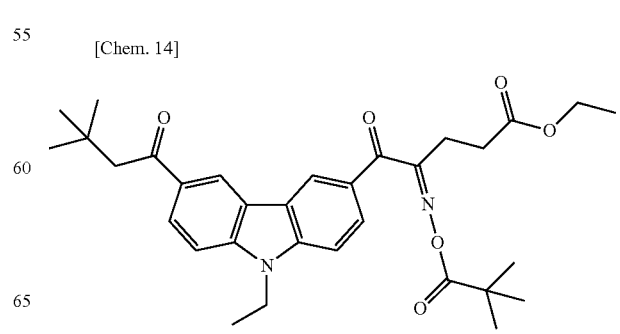

31
-continued
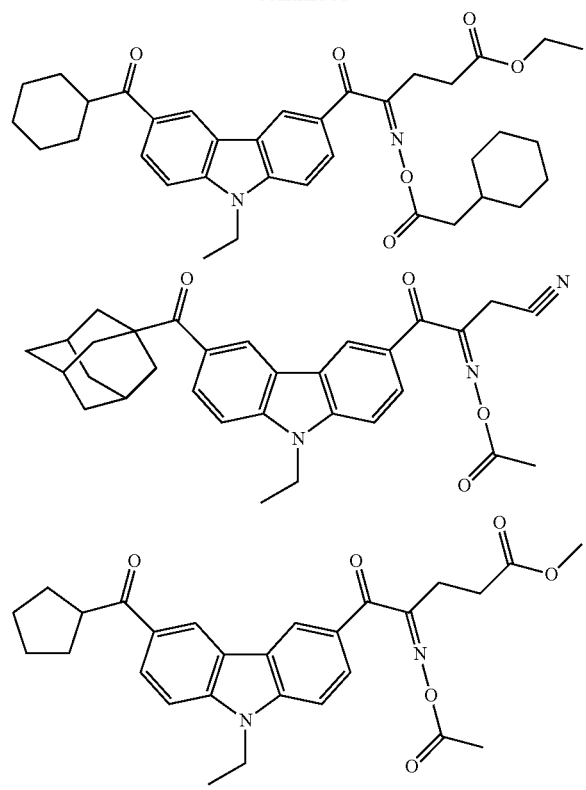
32
-continued
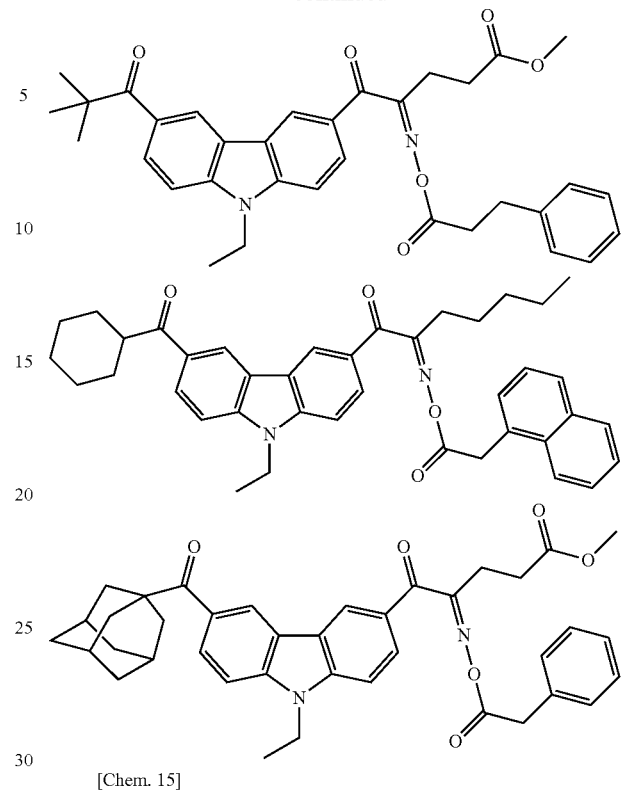
[Chem. 15]
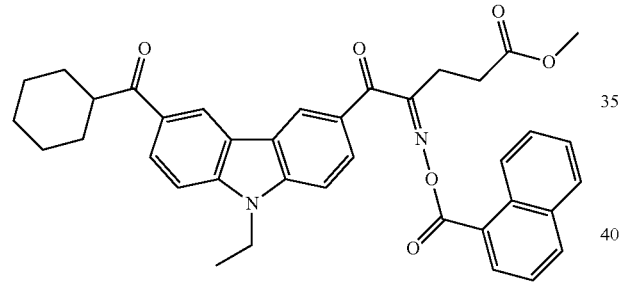
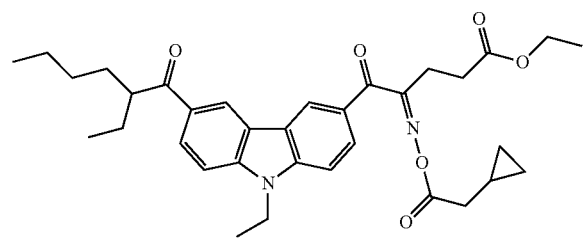
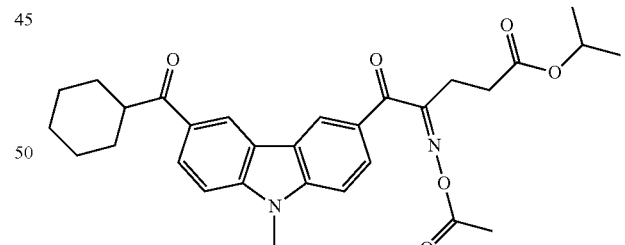
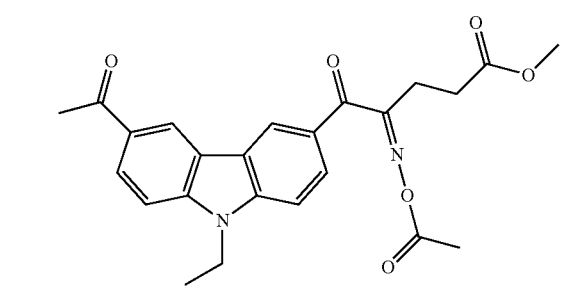
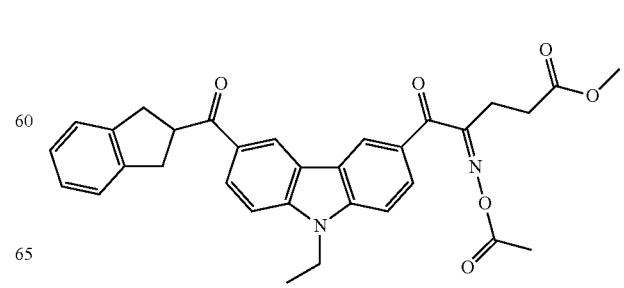

-continued

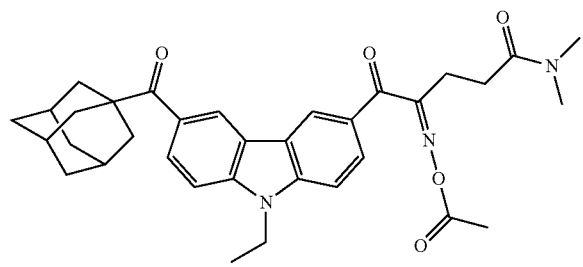

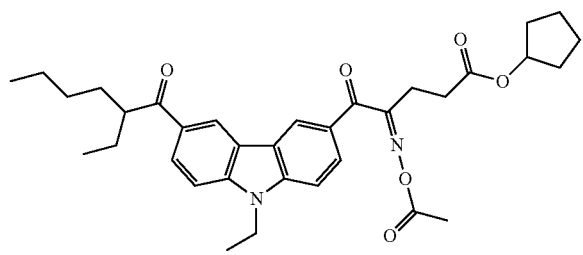

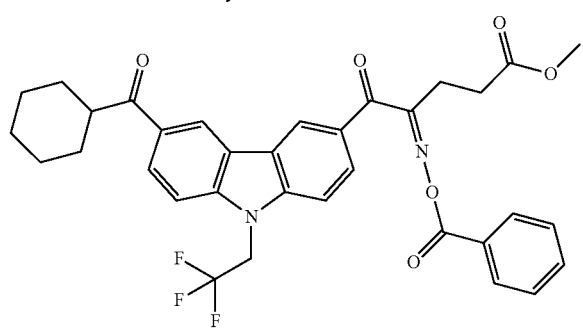

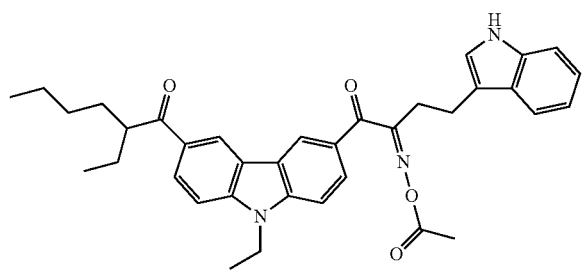

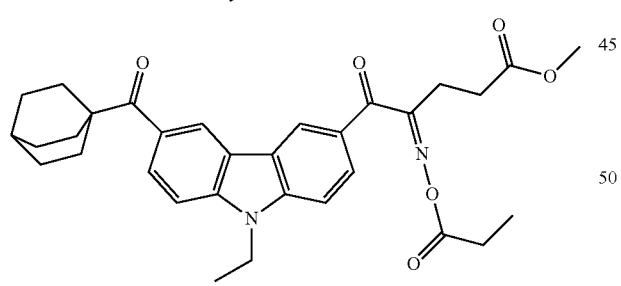

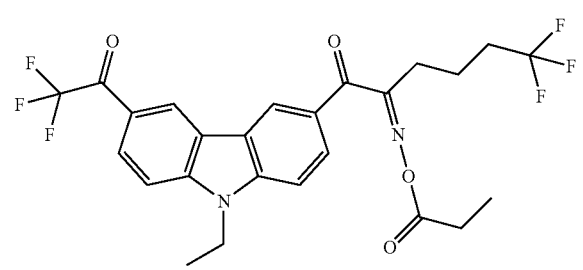

-continued

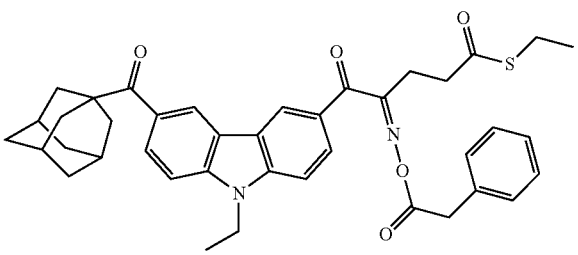

No particular limitation is imposed on the method for synthesizing compound (4), and compound (4) can be produced using a combination of commonly used synthesis methods. Specific examples include a method described in International Publication No. 2009/131189.

For example, as shown in a chemical formula below, an acyl group having $R^{25}$ and an acyl group having $R^{24}$ and $R^{23}$ can be introduced into a carbazole ring through a Friedel-Crafts reaction. The Friedel-Crafts reaction is described in, for example, Andrew Streitwieser. Jr. et. al, Introduction to Organic Chemistry, Macmillan Publishing Company, NewYork, P652-653 and Bradford p. Mundy et. al., Name Reactions and Reagents in Organic Synthesis, A Wiley-Interscience Publication, P82-83.

[Chem. 16]

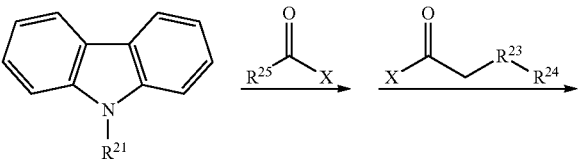

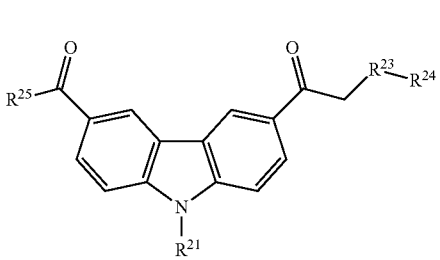

Methylene can be nitrosated by a method using nitrous acid or a nitrite.

A hydroxy group can be acylated by a method using a corresponding acid halide or anhydride and a base.

The nitrosation and acylation in the following chemical formula are described in, for example, Japanese Unexamined Patent Application Publication (Translation of PCT Application) No. 2004-534797 and Organic Reaction Volume VII, KRIEGER PUBLISHING COMPANY MALABAR, Florida, Chapter 6.

[Chem. 17]

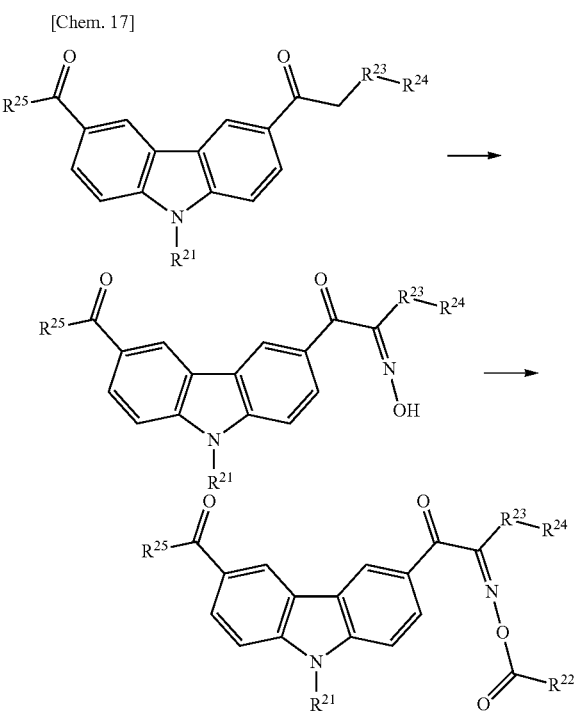

$R^{21}$ to $R^{25}$ above are the same as $R^{21}$ to $R^{25}$ in formula (4).

(Cationic Photopolymerization Initiator)

The cationic photopolymerization initiator used may be any known cationic photopolymerization initiator. Examples of the cationic photopolymerization initiator include aromatic onium salts. Specific examples of the aromatic onium salts include compounds containing an anionic component such as $SbF_6^-$, $BF_4^-$, $AsF_6^-$, $PF_6^-$, $CF_3SO_3^-$, or $B(C_6F_5)_4^-$ and an aromatic cationic component containing an atom such as iodine, sulfur, nitrogen, or phosphorus. Of these, diaryliodonium salts, triarylsulfonium salts, etc. are preferred. Any one of the above exemplified cationic photopolymerization initiators may be used alone, or any combination of two or more of them may be used at any ratio.

(Anionic Photopolymerization Initiator)

The anionic photopolymerization initiator used may be any known anionic photopolymerization initiator. Examples of the anionic photopolymerization initiator include amines. Examples of the amines include: amino group-containing compounds such as dimethylbenzylamine, dimethylaminomethylphenol, 1,8-diazabicyclo[5.4.0]undecene-7, and derivatives thereof; and imidazole compounds such as imidazole, 2-methylimidazole, 2-ethyl-4-methylimidazole, and derivatives thereof. Any one of the above-exemplified anionic photopolymerization initiators may be used alone, or any combination of two or more of them may be used at any ratio.

(Radical Photopolymerization Initiator)

The radical photopolymerization initiator used may be any known radical photopolymerization initiator. Examples of the radical photopolymerization initiator used include phosphine oxide compounds, azo compounds, azide compounds, organic peroxides, organic boronic acid salts, onium salts, bisimidazole derivatives, titanocene compounds, iodonium salts, organic thiol compounds, and halogenated hydrocarbon derivatives. Any one of the above-exemplified radical photopolymerization initiators may be used alone, or any combination of two or more of them may be used at any ratio. Of these, phosphine oxide compounds are preferred as described above.

No particular limitation is imposed on the type of phosphine oxide compound so long as the object and effects of the invention are not impaired. In particular, the phosphine oxide compound is preferably an acylphosphine oxide compound.

Examples of the acylphosphine oxide compound include monoacylphosphine oxide represented by (formula b) below and diacylphosphine oxide represented by (formula c) below. Any one of them may be used alone, or any combination of two or more of them may be used at any ratio.

[Chem. 18]

(formula b)

In (formula b), $R^7$ represents: an alkyl group having 1 to 18 carbon atoms; an alkyl group having 1 to 4 carbon atoms, a cycloalkyl group having 5 to 8 carbon atoms, a phenylalkyl group having 7 to 9 carbon atoms, a phenyl group, a naphthyl group, or a biphenyl group, each of these groups being substituted with a halogen or an alkoxy group having 1 to 6 carbon atoms; a phenyl group, a naphthyl group, or a biphenyl group, each of these groups being substituted with at least one selected from the group consisting of halogens, alkyl groups having 1 to 12 carbon atoms, and alkoxy groups having 1 to 12 carbon atoms; or a monovalent 5- or 6-membered heterocyclic ring containing N, O, or S.

$R^8$ represents: a phenyl group; a naphthyl group; a biphenyl group; a phenyl group, a naphthyl group, or a biphenyl group, each of these groups being substituted with at least one selected from the group consisting of halogens, alkyl groups having 1 to 12 carbon atoms, and alkoxy groups having 1 to 12 carbon atoms; a monovalent 5- or 6-membered heterocyclic ring containing N, O, or S; an alkoxy group having 1 to 18 carbon atoms; a phenoxy group; or a phenoxy group, a benzyloxy group, or a cyclohexyloxy group, each of these groups being substituted with a halogen, an alkyl group having 1 to 4 carbon atoms, or an alkoxy group having 1 to 4 carbon atoms. $R^8$ and $R^7$ may form a ring together with a phosphorus atom.

$R^9$ is: an alkyl group having 1 to 18 carbon atoms; an alkyl group having 1 to 4 carbon atoms, a cycloalkyl group having 5 to 8 carbon atoms, a phenylalkyl group having 7 to 9 carbon atoms, a phenyl group, a naphthyl group, or a biphenyl group, each of these groups being substituted with a halogen or an alkoxy group having 1 to 6 carbon atoms; a phenyl group, a naphthyl group, or a biphenyl group, each of these groups being substituted with at least one selected from the group consisting of halogens, alkyl groups having 1 to 12 carbon atoms, and alkoxy groups having 1 to 12 carbon atoms; a monovalent 5- or 6-membered heterocyclic ring containing N, O, or S; or a group represented by (formula b-I) below.

[Chem. 19]

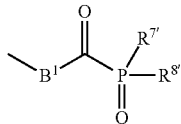

(formula b-I)

In (formula b-I), $B^1$ represents: an alkylene group having 2 to 8 carbon atoms or a cyclohexylene group having 2 to 8 carbon atoms; or a phenylene group or a biphenylene group, each of these groups being unsubstituted or substituted with a halogen, an alkyl group having 1 to 4 carbon atoms, or an alkoxy group having 1 to 4 carbon atoms.

$R^{7\prime}$ and $R^{8\prime}$ are the same groups as those described for $R^7$ and $R^8$, respectively, in (formula b) above.

In the molecules represented by (formula b) and (formula b-I), $R^7$ and $R^{7\prime}$ may be the same or different, and $R^8$ and $R^{8\prime}$ may be the same or different.

[Chem. 20]

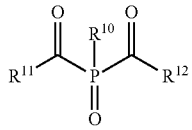

(formula c)

In (formula c), $R^{10}$ represents: an alkyl group having 1 to 18 carbon atoms; an alkyl group having 1 to 4 carbon atoms, a cycloalkyl group having 5 to 8 carbon atoms, a phenylalkyl group having 7 to 9 carbon atoms, a phenyl group, a naphthyl group, or a biphenyl group, each of these groups being substituted with a halogen or an alkoxy group having 1 to 6 carbon atoms; a phenyl group, a naphthyl group, or a biphenyl group, each of these groups being substituted with at least one selected from the group consisting of halogens, alkyl groups having 1 to 12 carbon atoms, and alkoxy groups having 1 to 12 carbon atoms; a monovalent 5- or 6-membered heterocyclic ring containing N, O, or S, an alkoxy group having 1 to 18 carbon atoms, or a phenoxy group; or a phenoxy group, a benzyloxy group, or a cyclohexyloxy group, each of these groups being substituted with a halogen, an alkyl group having 1 to 4 carbon atoms, or an alkoxy group having 1 to 4 carbon atoms.

$R^{11}$ and $R^{12}$ each independently represent: an alkyl group having 1 to 18 carbon atoms; an alkyl group having 1 to 4 carbon atoms, a cycloalkyl group having 5 to 8 carbon atoms, a phenylalkyl group having 7 to 9 carbon atoms, a phenyl group, a naphthyl group, or a biphenyl group, each of these groups being substituted with a halogen or an alkoxy group having 1 to 6 carbon atoms; a phenyl group, a naphthyl group, or a biphenyl group, each of these groups being substituted with at least one selected from the group consisting of halogens, alkyl groups having 1 to 12 carbon atoms, and alkoxy groups having 1 to 12 carbon atoms; or a monovalent 5- or 6-membered heterocyclic ring containing N, O, or S.

Specific examples of the compound represented by (formula b) or (formula c) above include 2,4,6-trimethylbenzoyldiphenylphosphine oxide, 2,4,6-trimethylbenzoylethoxyphenylphosphine oxide, 2,6-dimethoxybenzoylethoxyphenylphosphine oxide, 2,6-dichlorobenzoylethoxyphosphine oxide, 2,6-dichlorobenzoyldiphenylphosphine oxide, bis(2,6-dimethoxybenzoyl)-(2,4,4-trimethyl-pent-1-yl)-phosphine oxide, bis(2,4,6-trimethylbenzoyl)phenylphosphine oxide, bis(2,4,6-trimethylbenzoyl)-2,4,4-trimethyl-pentylphosphine oxide, and bis(2,4,6-trimethylbenzoyl)-(2,4-dipentyloxyphenyl)phosphine oxide.

Of these, the monoacylphosphine oxide compound is preferred because good recording sensitivity can be obtained.

<Component (e-1)>

Component (e-1) is a stable nitroxyl radical group-containing compound. The holographic recording medium composition of the present invention contains component (e-1). Therefore, even when an oxime ester-based photopolymerization initiator is used as component (d-1), coloration of the holographic recording medium after holographic recording can be reduced.

When component (e-1) has an isocyanate-reactive functional group, the isocyanate-reactive functional group reacts with the isocyanate group in component (a-1) and is thereby fixed to the resin matrix, and the stable nitroxyl radical group contained in component (e-1) improves the recording sensitivity, so that high M/# can be achieved.

Examples of the isocyanate-reactive functional group contained in component (e-1) are the same as those described for the isocyanate-reactive functional group contained in component (b-1).

No particular limitation is imposed on the type of component (e-1). Specific examples of component (e-1) include, but not limited to, stable nitroxyl radical compounds such as 2,2,6,6-tetramethylpiperidine-1-oxyl (TEMPO), 4-hydroxy-2,2,6,6-tetramethylpiperidine-1-oxyl (TEMPOL), 4-sulfanyl-2,2,6,6-tetramethylpiperidine-1-oxyl, 4-amino-2,2,6,6-tetramethylpiperidine-1-oxyl, 4-mercapto-2,2,6,6-tetramethylpiperidine-1-oxyl, 4-carboxy-2,2,6,6-tetramethylpiperidine-1-oxyl, 4-carbamoyl-2,2,6,6-tetramethylpiperidine-1-oxyl, 4-(2,3-epoxypropoxy)-2,2,6,6-tetramethylpiperidine-1-oxyl, 3-hydroxy-2,2,5,5-tetramethylpyrrolidine-1-oxyl, 3-sulfanyl-2,2,5,5-tetramethylpyrrolidine-1-oxyl, 3-amino-2,2,5,5-tetramethylpyrrolidine 1-oxyl, 3-mercapto-2,2,5,5-tetramethylpyrrolidine 1-oxyl, 3-carboxy-2,2,5,5-tetramethylpyrrolidine-1-oxyl, 3-carbamoyl-2,2,5,5-tetramethylpyrrolidine-1-oxyl, 3-(2,3-epoxypropoxy)-2,2,5,5-tetramethylpyrrolidine-1-oxyl, 3-hydroxy-2,2,5,5-tetramethylpyrroline-1-oxyl, 3-sulfanyl-2,2,5,5-tetramethylpyrroline-1-oxyl, 3-amino-2,2,5,5-tetramethylpyrroline-1-oxyl, 3-mercapto-2,2,5,5-tetramethylpyrroline-1-oxyl, 3-carboxy-2,2,5,5-tetramethylpyrroline-1-oxyl, 3-carbamoyl-2,2,5,5-tetramethylpyrroline-1-oxyl, and 3-(2,3-epoxypropoxy)-2,2,5,5-tetramethylpyrroline-1-oxyl.

Component (e-1) used may be 9-azabicyclo[3.3.1] nonane-N-oxyl (ABNO) and AZADOs such as 2-azaadamantane-N-oxyl (AZADO), 1-methyl-2-azaadamantane-N-oxyl (1-Me-AZADO), and 2-azanoradamantane-N-oxyl (nor-AZADO).

Any one of these compounds may be used alone, or any combination of two or more of them may be used at any ratio.

Of these, TEMPOL, 4-sulfanyl-2,2,6,6-tetramethylpiperidine-1-oxyl, 4-amino-2,2,6,6-tetramethylpiperidine-1-oxyl, and 4-mercapto-2,2,6,6-tetramethylpiperidine-1-oxyl are used preferably from the viewpoint of the stability of the compound and the reactivity with the isocyanate group. TEMPOL is particularly preferably used.

<Component (f-1)>

Preferably, the holographic recording medium composition of the present invention further contains, as component (f-1), a curing catalyst that facilitates the reaction between the isocyanate group-containing compound denoted as component (a-1) and the isocyanate-reactive functional group-containing compound denoted as (b-1). Preferably, a bismuth-based catalyst serving as Lewis acid is used as the curing catalyst denoted as component (f-1).

Examples of the bismuth-based catalyst include tris(2-ethylhexanoate) bismuth, tribenzoyloxy bismuth, bismuth triacetate, bismuth tris(dimethyldithiocarbamate), bismuth hydroxide, triphenylbismuth(V) bis(trichloroacetate), tris(4-methylphenyl)oxobismuth(V), and triphenylbis(3-chlorobenzoyloxy) bismuth(V).

Of these, trivalent bismuth compounds are preferred in terms of catalytic activity, and bismuth carboxylate and a compound represented by a general formula $Bi(OCOR)_3$ (R is a linear or branched alkyl group, a cycloalkyl group, or a substituted or unsubstituted aromatic group) are more preferred. Any one of these bismuth-based catalysts may be used alone, or any combination of two or more of them may be used at any ratio.

To control the reaction rate, an additional curing catalyst may be used in combination with the bismuth-based catalyst. No particular limitation is imposed on the catalyst that can be used in combination with the bismuth-based catalyst so long as it does not depart from the spirit of the invention. To obtain the synergistic effect of the catalysts, it is preferable to use a compound having an amino group in part of its structure. Examples of such a compound include amine compounds such as triethylamine (TEA), N,N-dimethylcyclohexylamine (DMEDA), N,N,N',N'-tetramethylethylenediamine (TMEDA), N,N,N',N'-tetramethylpropane-1,3-diamine (TMPDA), N,N,N',N'-tetramethylhexane-1,6-diamine (TMHMDA), N,N,N',N'',N''-pentamethyldiethylenetriamine (PMDETA), N,N,N',N'',N''-pentamethyldipropylene-triamine (PMDPTA), triethylenediamine (TEDA), N,N'-dimethylpiperazine (DMP), N, -methyl, N'-(2dimethylamino)-ethylpiperazine (TMNAEP), N-methylmorpholine (NMMO), N.(N',N'-dimethylaminoethyl)-morpholine (DMAEMO), bis(2-dimethylaminoethyl) ether (BDMEE), ethylene glycol bis(3-dimethyl)-aminopropyl ether (TMEGDA), and diisopropylethylamine (DIEA). Any one of these compounds may be used alone, or any combination of two or more of them may be used at any ratio.

<Additional Components>

The holographic recording medium composition of the present invention may further contain additional components other than components (a-1) to (f-1) described above so long as they do not depart from the spirit of the invention.

Examples of the additional components include: a solvent, a plasticizer, a dispersant, a leveling agent, an antifoaming agent, an adhesion promoter, etc. that are used to prepare the recording layer of the holographic recording medium; and a chain transfer agent, a polymerization terminator, a compatibilizer, a reaction aid, a sensitizer, an antioxidant, etc. that are used to control the recording reaction. Any one of these components may be used alone, or any combination of two or more of them may be used at any ratio.

Of these, it is preferable to use a chain transfer agent. In particular, a compound having a terpenoid skeleton is more preferably used. The compound having a terpenoid skeleton may be any compound having the terpenoid skeleton. Specific examples thereof include monoterpenes (such as camphor, menthol, limonene, terpineol, geraniol, nerol, citronellol, terpinolene, and α, β, and γ-terpinenes); sesquiterpenes (such as farnesol, nerolidol, and caryophyllene); diterpenes (such as abietic acid, taxol, pimaric acid, geranylgeraniol, and phytol); triterpenes (such as squalene); and carotenoids. Of these, terpinolene, α-terpinene, β-terpinene, γ-terpinene, etc. are particularly preferred. Any one of the above-exemplified terpenoid skeleton-containing compounds may be used alone, or any combination of two or more of them may be used at any ratio.

<Compositional Ratios of Components of Holographic Recording Medium Composition>

The contents of the components of the holographic recording medium composition of the present invention are freely set so long as they do not depart from the spirit of the invention. However, preferably, the contents of the components are within the following ranges.

The total content of components (a-1) and (b-1) in the holographic recording medium composition of the present invention is generally 0.1% by weight or more, preferably 10% by weight or more, and more preferably 35% by weight or more and is generally 99.9% by weight or less, preferably 99% by weight or less, and more preferably 98% by weight or less. When the total content is equal to or more than the above lower limit, the recording layer can be easily formed. When the total content is equal to or less than the above upper limit, the contents of other essential components can be ensured.

The ratio of the number of isocyanate-reactive functional groups in component (b-1) to the number of isocyanate groups in component (a-1) is preferably 0.1 or more and more preferably 0.5 or more and is generally 10.0 or less and preferably 2.0 or less. When this ratio is within the above range, the number of unreacted functional groups is small, and storage stability is improved.

The content of component (c-1) in the holographic recording medium composition of the present invention is generally 0.1% by weight or more, preferably 1% by weight or more, and more preferably 2% by weight or more and is generally 80% by weight or less, preferably 50% by weight or less, and more preferably 30% by weight or less. When the amount of component (c-1) is equal to or more than the above lower limit, sufficient diffraction efficiency is obtained. When the amount is equal to or less than the above upper limit, the compatibility of the recording layer is maintained.

The ratio of the amount of component (d-1) in the holographic recording medium composition of the present invention to the amount of component (c-1) is generally 0.1% by weight or more, preferably 0.2% by weight or more, and more preferably 0.3% by weight or more and is generally 20% by weight or less, preferably 18% by weight or less, and more preferably 16% by weight or less. When the ratio of component (d-1) is equal to or more than the above lower limit, sufficient recording sensitivity is obtained. When the ratio is equal to or less than the above upper limit, a reduction in sensitivity caused by a bimolecular termination reaction due to excessive generation of radicals can be prevented.

As for the content of component (e-1) in the holographic recording medium composition of the present invention, the molar ratio of component (e-1) to component (d-1) (component (e-1)/component (d-1)) is generally 0.1 or more, particularly preferably 0.2 or more, and most preferably 0.3 or more and is generally 10 or less, particularly preferably 8 or less, and most preferably 6 or less.

When component (e-1)/component (d-1) is equal to or more than the above lower limit, the effect of improving M/# due to the presence of component (e-1) can be effectively obtained. When the ratio is equal to or less than the above upper limit, a radical polymerization reaction proceeds during exposure to light performed for the purpose of recording. In this case, the degree of refractive index modulation necessary to form a diffraction grating can be obtained, and sufficient recording sensitivity can be obtained.

Preferably, the content of component (f-1) in the holographic recording medium composition of the present invention is determined in consideration of the rate of the reaction between component (a-1) and component (b-1). The content of component (f-1) is generally 5% by weight or less, preferably 4% by weight or less, and more preferably 1% by weight or less and is preferably 0.001% by weight or more.

It is only necessary that the total amount of components other than components (a-1) to (f-1) in the holographic recording medium composition of the present invention be 30% by weight or less, and the total amount is preferably 15% by weight or less and more preferably 5% by weight or less.

<Method for Producing Holographic Recording Medium Composition>

To produce the holographic recording medium composition of the present invention, components (a-1) to (e-1), preferably components (a-1) to (f-1), may be freely combined and mixed in any order. In this case, additional components may be combined and mixed.

The holographic recording medium composition of the present invention can be produced by, for example, the following method, but the invention is not limited thereto.

All the components other than component (b-1) and component (f-1) are mixed, and the mixture is used as solution A. Component (b-1) and component (f-1) are mixed, and the mixture is used as solution B. Preferably, these solutions are subjected to dehydration and deaeration. If dehydration and deaeration are not performed or are insufficient, air bubbles may be generated during production of the medium, and a uniform recording layer may not be obtained. During dehydration and deaeration, heating and evacuation may be performed so long as the components are not impaired.

Component (e-1) is a minority component. Therefore, to improve the uniformity and dispersibility of component (e-1) in the composition and to obtain chemical bonding with component (a-1) reliably, it is preferable that part, e.g., 10 to 90% by weight, of component (a-1), part, e.g., 10 to 90% by weight, of component (f-1), and component (e-1) are mixed in advance to prepare a master batch and then the master batch is mixed with solution A prepared by mixing all the components other than components (b-1), (e-1), and (f-1) (as for component (a-1), the remainder thereof not used for the master batch) and solution B prepared by mixing components (b-1) and (f-1) (as for component (f-1), the remainder thereof not used for the master batch).

Solutions A and B or solutions A and B and the master batch for component (e-1) are mixed immediately before molding. In this case, a conventional mixing technique may be used. When solutions A and B are mixed or solutions A and B and the master batch for component (e-1) are mixed, degassing may be optionally performed in order to remove residual gasses. Preferably, solutions A and B or solutions A and B and the master batch for component (e-1) are subjected to a filtration operation separately or after mixing in order to remove foreign substances and impurities. More preferably, these solutions are filtrated separately. An isocyanate functional prepolymer prepared through a reaction between excessive component (a-1) and component (b-1) may be used as component (a-1)'. An isocyanate-reactive prepolymer prepared through a reaction between excessive component (b-1) and component (a-1) may be used as component (b-1)'.

[Cured Product For Holographic Recording Medium]

The cured product for a holographic recording medium of the present invention can be obtained by curing the holographic recording medium composition of the present invention.

No particular limitation is imposed on the method for forming the cured product for a holographic recording medium of the present invention. To produce the holographic recording medium composition of the present invention, the above-described solutions A and B or the above-described solutions A and B and the master batch for component (e-1) are mixed. Then the mixture is cured to produce the cured product for a holographic recording medium.

In this case, the mixture may be heated to 30 to 100° C. for 1 to 72 hours in order to facilitate the curing reaction.

The cured product for a holographic recording medium of the present invention can be produced also by a recording layer forming method in a method for producing the holographic recording medium of the present invention described later.

In the cured product for a holographic recording medium of the present invention that is produced by curing the holographic recording medium composition of the present invention, the total content of the PG unit and the TMG unit derived from component (b-1) in the matrix formed from component (a-1) and component (b-1) is 30% by weight or less, preferably 27% by weight or less, and particularly preferably 25% by weight or less because of the same reason as that for the holographic recording medium composition of the present invention. Most preferably, no PG unit and no TMG unit are contained.

Moreover, in the cured product for a holographic recording medium of the present invention, the content of the CL unit derived from component (b-1) in the matrix formed from component (a-1) and component (b-1) is 20% by weight or more, particularly preferably 25% by weight or more, and most preferably 30 to 70% by weight.

The contents of the PG, TMG, and CL units derived from component (b-1) in the cured product for a holographic recording medium of the present invention can be quantified, for example, by subjecting the cured product for a holographic recording medium to alkaline hydrolysis and analyzing the obtained polyol component using nuclear magnetic resonance (NMR) or gas chromatography mass spectrometry (GC/MS).

[Stacked Body for Holographic Recording Medium]

By stacking the cured product for a holographic recording medium of the present invention that is used as a recording layer onto a support, a stacked body for a holographic recording medium can be obtained. The support may be disposed on one side of the recording layer formed from the cured product for a holographic recording medium or may be disposed on both sides.

The details of the recording layer and the support will be described later.

A method for forming the recording layer formed from the cured product for a holographic recording medium is the same as that in the method for forming the holographic recording medium of the present invention.

[Holographic Recording Medium]

By subjecting the holographic recording medium composition of the present invention to interference exposure, the holographic recording medium of the present invention can be obtained.

A preferred mode of the holographic recording medium of the present invention will be described below.

The holographic recording medium of the present invention includes the recording layer and optionally includes the support and additional layers. Generally, the holographic recording medium includes the support, and the recording layer and the additional layers are stacked on the support to form the holographic recording medium. However, when the recording layer and the additional layers have the strength and durability required for the medium, the holographic recording medium may include no support. Examples of the additional layers include a protective layer, a reflecting layer, and an anti-reflection layer (anti-reflection film).

Preferably, the recording layer of the holographic recording medium of the present invention is formed from the holographic recording medium composition of the present invention.

<Recording Layer>

The recording layer of the holographic recording medium of the present invention is a layer formed from the holographic recording medium composition of the present invention, and information is recorded in the recording layer. The information is generally recorded as a hologram. As described later in detail in a recording method section, the polymerizable monomer contained in the recording layer partially undergoes a chemical change such as polymerization during holographic recording etc. Therefore, in the holographic recording medium after recording, part of the polymerizable monomer is consumed and present as a reacted compound such as a polymer.

No particular limitation is imposed on the thickness of the recording layer, and the thickness may be appropriately set in consideration of the recording method etc. The thickness is generally 1 μm or more and preferably 10 μm or more and is generally 3000 μm or less and preferably 2000 μm or less. When the thickness of the recording layer is equal to or more than the above lower limit, selectivity for holograms when multiple recording is performed on the holographic recording medium is high, and therefore the degree of multiple recording can be increased. When the thickness of the recording layer is equal to or less than the above upper limit, the recording layer as a whole can be formed uniformly. Therefore, the holograms can have uniform diffraction efficiency, and multiple recording can be performed with a high S/N ratio.

Preferably, the rate of shrinkage of the recording layer due to exposure to light during information recording or reproduction is 0.5% or less.

<Support>

No particular limitation is imposed on the details of the support so long as it has the strength and durability required for the medium, and any support can be used.

No limitation is imposed on the shape of the support, and the support is generally formed into a flat plate or a film.

No limitation is imposed on the material forming the support, and the material may be transparent or may be opaque.

Examples of the transparent material for the support include: organic materials such as acrylic, polyethylene terephthalate, polyethylene naphthoate, polycarbonate, polyethylene, polypropylene, amorphous polyolefin, polystyrene, and cellulose acetate; and inorganic materials such as glass, silicon, and quartz. Of these, polycarbonate, acrylic, polyester, amorphous polyolefin, glass, etc. are preferred, and polycarbonate, acrylic, amorphous polyolefin, and glass are more preferred.

Examples of the opaque material for the support include: metals such as aluminum; and a coating prepared by coating the transparent support with a metal such as gold, silver, or aluminum or a dielectric such as magnesium fluoride or zirconium oxide.

No particular limitation is imposed on the thickness of the support. Preferably, the thickness is in the range of generally 0.05 mm or more and 1 mm or less. When the thickness of the support is equal to or more than the above lower limit, the mechanical strength of the holographic recording medium can be ensured, and warpage of the substrate can be prevented. When the thickness of the support is equal to or less than the above upper limit, the transmission amount of light can be ensured, and an increase in cost can be prevented.

The surface of the support may be subjected to surface treatment. The surface treatment is generally performed in order to improve the adhesion between the support and the recording layer. Examples of the surface treatment include corona discharge treatment performed on the support and the formation of an undercoat layer on the support in advance. Examples of the composition for the undercoat layer include halogenated phenols, partially hydrolyzed vinyl chloride-vinyl acetate copolymers, and polyurethane resins.

The surface treatment on the support may be performed for a purpose other than the improvement in adhesion. Examples of such surface treatment include: reflecting coating treatment in which a reflecting coating layer is formed using a metal material such as gold, silver, or aluminum; and dielectric coating treatment in which a dielectric layer formed of magnesium fluoride, zirconium oxide, etc. is formed. Such a layer may be formed as a single layer, or two or more layers may be formed.

The surface treatment on the support may be performed for the purpose of controlling the gas and water permeability of the substrate. For example, when the support supporting the recording layer has the function of preventing permeation of gas and water, the reliability of the medium can be further improved.

The support may be disposed only on one of the upper and lower sides of the recording layer of the holographic recording medium of the present invention or may be disposed on both sides. When supports are disposed on both the upper and lower sides of the recording layer, at least one of the supports is made transparent so that it can transmit active energy rays (such as excitation light, reference light, and reproduction light).

When the holographic recording medium has the support on one side or both sides of the recording layer, a transmission hologram or a reflection hologram can be recorded. When a support having anti-reflection characteristics is used on one side of the recording layer, a reflection hologram can be recorded.

A pattern for data addressing may be provided on the support. In this case, no limitation is imposed on the patterning method. For example, irregularities may be formed on the support itself, or the pattern may be formed on the reflecting layer described later. The pattern may be formed using a combination of these methods.

<Protective Layer>

The protective layer is a layer for preventing a reduction in the sensitivity of the recording layer and deterioration in its storage stability due to oxygen or moisture. No limitation is imposed on the specific structure of the protective layer, and any known protective layer can be used. For example, a layer formed of a water-soluble polymer, an organic or inorganic material, etc. can be formed as the protective layer.

No particular limitation is imposed on the formation position of the protective layer. The protective layer may be formed, for example, on the surface of the recording layer or between the recording layer and the support or may be formed on the outer surface side of the support. The protective layer may be formed between the support and another layer.

<Reflecting Layer>

The reflecting layer is formed when the holographic recording medium formed is of the reflection type. In the reflection holographic recording medium, the reflecting layer may be formed between the support and the recording layer or may be formed on the outer side of the support. Generally, it is preferable that the reflecting layer is present between the support and the recording layer.

Any known reflecting layer may be used, and a thin metal film, for example, may be used.

<Anti-Reflection Film>

In each of the transmission and reflection holographic recording mediums, an anti-reflection film may be disposed on the side on/from which object light and reading light are incident/emitted or between the recording layer and the support. The anti-reflection film improves the efficiency of utilization of light and prevents the occurrence of a ghost image.

Any known anti-reflection film may be used.

<Method for Producing Holographic Recording Medium>

No limitation is imposed on the method for producing the holographic recording medium of the present invention. For example, the holographic recording medium can be produced by coating the support with the holographic recording medium composition of the present invention without using a solvent to form the recording layer. Any known coating method can be used. Specific examples of the coating method include a spray method, a spin coating method, a wire bar method, a dipping method, an air knife coating method, a roll coating method, a blade coating method, and a doctor roll coating method.

When a recording layer with a large thickness is formed, a method in which the holographic recording medium composition of the present invention is molded using a die, a method in which the holographic recording medium composition is applied to a release film and punched with a die, etc. may be used.

The holographic recording medium may be produced by mixing the holographic recording medium composition of the present invention with a solvent or an additive to prepare a coating solution, coating the support with the coating solution, and then drying the coating solution to form the recording layer. In this case also, any coating method can be used. For example, any of the above described methods can be used.

No limitation is imposed on the solvent used for the coating solution. It is generally preferable to use a solvent that can dissolve the component used sufficiently, provides good coating properties, and does not damage the support such as a resin substrate. Examples of the solvent include: ketone-based solvents such as acetone and methyl ethyl ketone; aromatic solvents such as toluene and xylene; alcohol-based solvents such as methanol and ethanol; ketone alcohol-based solvents such as diacetone alcohol; ether-based solvents such as tetrahydrofuran; halogen-based solvents such as dichloromethane and chloroform; cellosolve-based solvents such as methyl cellosolve and ethyl cellosolve; propylene glycol-based solvents such as propylene glycol monomethyl ether and propylene glycol monoethyl ether; ester-based solvents such as ethyl acetate and methyl 3-methoxypropionate; perfluoroalkyl alcohol-based solvents such as tetrafluoropropanol; highly polar solvents such as dimethylformamide and dimethyl sulfoxide; chain hydrocarbon-based solvents such as n-hexane; cyclic hydrocarbon-based solvents such as cyclohexane and cyclooctane; and mixtures of these solvents.

One of these solvents may be used alone, or any combination of two or more of them may be used at any ratio.

No limitation is imposed on the amount of the solvent used. However, in terms of coating efficiency and handleability, it is preferable to prepare a coating solution with a solid concentration of about 1 to about 1000% by weight.

When the resin matrix formed from components (a-1) and (b-1) in the holographic recording medium composition of the present invention is thermoplastic, the recording layer can be formed by molding the holographic recording medium composition of the present invention using, for example, an injection molding method, a sheet molding method, or a hot press method.

When the amount of volatile components in the resin matrix formed from components (a-1) and (b-1) is small and the resin matrix is photocurable or thermosetting, the recording layer can be formed by molding the holographic recording medium composition of the present invention using, for example, a reaction injection molding method or a liquid injection molding method. In this case, the molded product itself can be used as a holographic recording medium when the molded product has sufficient thickness, sufficient stiffness, sufficient strength, etc.

Examples of the holographic recording medium production method include: a production method in which the recording layer is formed by coating the support with the holographic recording medium composition fused by heat and cooling the holographic recording medium composition to solidify the composition; a production method in which the recording layer is formed by coating the support with the holographic recording medium composition in liquid form and subjecting the holographic recording medium composition to thermal polymerization to cure the composition; and a production method in which the recording layer is formed by coating the support with the holographic recording medium composition in liquid form and subjecting the holographic recording medium composition to photopolymerization to cure the composition.

The thus-produced holographic recording medium can be in the form a self-supporting slab or disk and can be used for three-dimensional image display devices, diffraction optical elements, large-capacity memories, etc.

In particular, the holographic recording medium of the present invention that uses the holographic recording medium composition of the present invention has high M/#, is prevented from undergoing coloration, and is therefore useful for light guide plates for AR glasses.

<Large-Capacity Memory Applications>

Information is written (recorded)/read (reproduced) in/from the holographic recording medium of the present invention by irradiating the medium with light.

To record information, light capable of causing a chemical change of the polymerizable monomer, i.e., its polymerization and a change in concentration, is used as the object light (referred to also as recording light).

For example, when information is recorded as a volume hologram, the object light together with the reference light is applied to the recording layer to allow the object light to interfere with the reference light in the recording layer. In this case, the interfering light causes polymerization of the polymerizable monomer and a change in its concentration within the recording layer. Therefore, the interference fringes cause refractive index differences within the recording layer, and the information is recorded as a hologram through the interference fringes recorded in the recording layer.

To reproduce the volume hologram recorded in the recording layer, prescribed reproduction light (generally the reference light) is applied to the recording layer. The applied reproduction light is diffracted by the interference fringes. Since the diffracted light contains the same information as that in the recording layer, the information recorded in the recording layer can be reproduced by reading the diffracted light using appropriate detection means.

The wavelength ranges of the object light, the reproduction light, and the reference light can be freely set according to their applications and may be the visible range or the ultraviolet range. Preferred examples of such light include light from lasers with excellent monochromaticity and directivity such as: solid lasers such as ruby, glass, Nd—YAG, Nd—YVO$_4$ lasers; diode lasers such as GaAs, InGaAs, and GaN lasers; gas lasers such as helium-neon, argon, krypton, excimer, and CO$_2$ lasers; and dye lasers including dyes.

No limitation is imposed on the amounts of irradiation with the object light, the reproduction light, and the reference light, and these amounts can be freely set so long as recording and reproduction are possible. If the amounts of irradiation are extremely small, the chemical change of the polymerizable monomer is too incomplete, and the heat resistance and mechanical properties of the recording layer may not be fully obtained. If the amounts of irradiation are extremely large, the components of the recording layer (the components of the holographic recording medium composition of the present invention) may deteriorate. Therefore, the object light, the reproduction light, and the reference light are applied at generally 0.1 J/cm$^2$ or more and 20 J/cm$^2$ or less according to the chemical composition of the holographic recording medium composition of the present invention used to form the recording layer, the type of photopolymerization initiator, the amount of the photopolymerization initiator mixed, etc.

Examples of the holographic recording method include a polarized collinear holographic recording method and a reference light incidence angle multiplexing holographic recording method. When the holographic recording medium of the present invention is used as a recording medium, good recording quality can be provided using any of the recording methods.

The holographic recording medium of the present invention is characterized in that M/# and light transmittance are high and that the amount of change in chromaticity is small.

The refractive index modulation generated by holographic recording is measured as diffraction efficiency. The holographic recording can be performed in a multiplexed manner. Examples of the multiplexing method include an angle multiplexing method in which recording is performed while incident angles of light beams intersecting at a fixed angle are changed, a shift multiplexing method in which the recording position is changed while the incident angles are not changed, and a wavelength multiplexing method in which recording is performed while the wavelength is changed. Of these, the angle multiplexing is simple and easy, and the materials and the performance of each components can be specified.

The value M/#, which is the sum of the square roots of diffraction efficiency values over the entire multiplexing range, is a measure of the recording capacity. The larger the value M/#, the better the performance of the medium. Generally, as the content of the polymerizable monomer increases, the diffraction efficiency increases, and the M/# also increases.

The M/# of the recording layer of the holographic recording medium of the present invention is 20 or more, preferably 30 or more, and still more preferably 35 or more, when the thickness of the recording layer used for the evaluation is 500 μm. As described above, the value of the M/# is preferably as large as possible, and the upper limit of the M/# can vary according to the necessary recording capacity.

The M/# is measured by a method described later in Examples.

Layers other than the recording layer such as the substrate, the protective layer, and the reflecting layer, etc. included in the holographic recording medium have no significant influence on the M/# value. Therefore, the M/# values of mediums having different layer structures excluding the recording layer can be directly compared with each other.

The light transmittance of the holographic recording medium of the present invention is an important indicator. The transmittance before recording is determined by the reflectance at the substrate-air interface and absorption by the unreacted initiator in the recording medium and can therefore be computed using the reflectance at the substrate-air interface, the molar absorption coefficient and concentration of the initiator in the holographic recording medium, and the thickness of the holographic recording medium. The light transmittance obtained by computation is referred to as design transmittance.

The design transmittance of the holographic recording medium is computed from the following formula using the reflectance of the substrate-air interface, the molar absorption coefficient of the photopolymerization initiator in the holographic recording medium, the concentration of the photopolymerization initiator in the holographic recording medium, and the thickness of the holographic recording medium.

$$T = R^2 \times 10^{(-\varepsilon \times c \times d)}$$

Here, T is the design transmittance, and R is the reflectance at the substrate-air interface. ε is the molar absorption coefficient of the photopolymerization initiator, and c is the concentration of the polymerization initiator in the holographic recording medium. d is the thickness of the holographic recording medium.

In some cases, the transmittance measured before recording may be lower than the design transmittance. This suggests that the holographic recording medium is tinted for some other reasons. The coloration of the holographic recording medium leads to a reduction in image quality when the holographic recording medium is used for light guide plates for AR glasses. Therefore, it can be said that the smaller the difference between the design transmittance and the transmittance before recording, the higher the performance of the holographic recording medium.

Preferably, the light used to measure the light transmittance has a wavelength equal to or close to the recording wavelength. However, before recording, the chemical change of the photopolymerization initiator in the recording layer included in the holographic recording medium is significant, and the light transmittance varies with time. Therefore, the light transmittance before recording must be measured in a sufficiently short time (about 1 second) in order to obtain a reliable and reproduceable measurement value. However, after recording, the photopolymerization initiator has been consumed, and no temporal change occurs, and therefore the light transmittance can be measured without concern for the measurement time.

It is generally preferable that the design transmittance coincides with the transmittance before recording. When they differ from each other, the difference is preferably about 3% or less, more preferably 2% or less, and still more preferably 1% or less. In the holographic recording medium of the present invention, when the recording layer has a thickness of 500 μm, its transmittance evaluated before recording can be within the above range and can be generally 3% or less and preferably 1% or less. Specifically, the light transmittance is measured using a method described later in Examples.

In the holographic recording medium of the present invention, even when the photopolymerization initiator used contains an oxime ester-based photopolymerization initiator, the amounts of change in chromaticity, i.e., a Δx value and a Δy value, measured by a method described later in Examples are preferably 0.0040 or less, more preferably 0.0030 or less, and still more preferably 0.0025 or less. When the Δx value and the Δy value are equal to or less than the above upper limit, coloration after postexposure is small. Therefore, for example, in the AR glass light guide plate applications, a field of view with no coloration can be provided while an increase in viewing angle, a reduction in color unevenness, and an improvement in brightness can be achieved.

<AR Glass Light Guide Plate Applications>

Volume holograms are recorded in the holographic recording medium of the present invention in the same manner as in the large-capacity memory applications.

The volume holograms recorded in the recording layer are irradiated with prescribed reproduction light through the recording layer. The applied reproduction light is diffracted by the interference fringes. In this case, even when the wavelength of the reproduction light does not coincide with the wavelength of the recording light, diffraction occurs when the Bragg condition for the interference fringes is satisfied. Therefore, by recording interference fringes corresponding to the wavelengths and incident angles of reproduction light beams to be diffracted, the reproduction light beams in a wide wavelength range can be diffracted, and the color display range of AR glasses can be increased.

By recording interference fringes corresponding to the wavelength and diffraction angle of reproduction light, the reproduction light entering from the outside of the holographic recording medium can be guided to the inside of the holographic recording medium, and the reproduction light guided inside the holographic recording medium can be reflected, split, and expanded or reduced in size. Moreover, the reproduction light guided inside the holographic recording medium can be emitted to the outside of the holographic recording medium. This allows the viewing angle of AR glasses to be increased.

The wavelength ranges of the object light and the reproduction light can be freely set according to their applications, and the object light and the reproduction light may be in the visible range or in the ultraviolet range. Preferred examples of the object light and the reproduction light include light from the above-described lasers. The reproduction light is not limited to light from a laser etc., and display devices such as liquid crystal displays (LCDs), organic electroluminescent displays (OLEDs), etc. can also be used preferably.

No limitation is imposed on the amounts of irradiation with the object light, the reproduction light, and the reference light, and these amounts can be freely set so long as recording and reproduction are possible. If the amounts of irradiation are extremely small, the chemical change of the polymerizable monomer is too incomplete, and the heat resistance and mechanical properties of the recording layer may not be fully obtained. If the amounts of irradiation are extremely large, the components of the recording layer (the components of the holographic recording medium composition of the present invention) may deteriorate. Therefore, the object light, the reproduction light, and the reference light are applied at generally 0.1 $J/cm^2$ or more and 20 $J/cm^2$ or less according to the chemical composition of the holographic recording medium composition of the present invention used to form the recording layer, the type of photopolymerization initiator, the amount of the photopolymerization initiator mixed, etc.

EXAMPLES

The present invention will be described in more detail by way of Examples. However, the present invention is not limited to the Examples so long as the invention does not depart from the scope thereof.

[Materials used]

Raw materials of compositions used in the Examples, Comparative Examples, and Reference Examples are as follows.

Component (a-1): isocyanate group-containing compound
  DURANATE (registered trademark) TSS-100: hexamethylene diisocyanate-based polyisocyanate (NCO 17.6%) (manufactured by Asahi Kasei Corporation)

Component (b-1): isocyanate-reactive functional group-containing compound
  ADEKA POLYETHER P-400: polypropylene glycol (molecular weight 400) (manufactured by ADEKA)
  PTMG-650: polytetramethylene glycol (molecular weight 650) (manufactured by Wako Pure Chemical Industries, Ltd.)
  ADEKA POLYETHER GM-30: ethylene oxide-modified product of trimethylolpropane (molecular weight 300) (manufactured by ADEKA)
  SH6: caprolactone-modified product of PTMG-650 (Mw 1000) (produced by method described later)
  PLACCEL PCL-205U: polycaprolactonediol (molecular weight 530) (manufactured by Daicel Corporation)
  PLACCEL PCL-305: polycaprolactonetriol (molecular weight 550) (manufactured by Daicel Corporation)
  PLACCEL PCL-303: polycaprolactonetriol (molecular weight 300) (manufactured by Daicel Corporation)
  NIPPOLLAN 141: polyesterpolyol (molecular weight 1060) (manufactured by TOSOH Corporation)
  NIPPOLLAN 1100: polyesterpolyol (molecular weight 540) (manufactured by TOSOH Corporation)
  NL1050B: polycarbonatediol (molecular weight 1050) (manufactured by Mitsubishi Chemical Corporation)
  BY16-750: hydroxy-terminated polydimethylsiloxane (molecular weight 1500) (manufactured by Dow Toray Co., Ltd.)

Component (c-1): polymerizable monomer
  2,4-Bis(4-dibenzothiophenyl)-1-phenyl acrylate (BDTPA: molecular weight 512.64)

HLM101: 2,2-bis(4-dibenzothiophenylthiomethyl)-3-(4-dibenzothiophenylthio)propyl acrylate (molecular weight 785.10)

Component (d-1): photopolymerization initiator

HLI02: 1-(9-ethyl-6-cyclohexanoyl-9H-carbazol-3-yl)-1-(O-acetyloxime)glutaric acid methyl ester 2,4,6-trimethylbenzoyl-diphenyl-phosphine oxide (TPO): manufactured by TOKYO CHEMICAL INDUSTRY Co., Ltd.

PIO16: 1-(9-ethyl-6-(2-methylbenzoyl)-9H-carbazol-3-yl)-1-(O-acetyloxime)glutaric acid methyl ester Component (e-1): stable nitroxyl radical group-containing compound 4-Hydroxy-2,2,6,6-tetramethylpiperidine-1-oxyl free radical (TEMPOL): manufactured by TOKYO CHEMICAL INDUSTRY Co., Ltd.

2,2,6,6-Tetramethylpiperidine (TEMPO)

2-Azanoradamantane-N-oxyl (nor-AZADO)

Component (f-1): curing catalyst

Octylic acid solution of tris(2-ethylhexanoate)bismuth (amount of effective component 56% by weight)

Component (g-1): additional component

Methyl linoleate (LM): manufactured by TOKYO CHEMICAL INDUSTRY Co., Ltd.

Methyl linoleate was used instead of component (e-1) in Comparative Examples 1-1, 2-1 to 2-3.

[Holographic Recording and Evaluation Methods]

Holographic recording medium composition evaluation samples produced in Examples and Comparative Examples were used to perform holographic recording and evaluate the holographic recording performance of each holographic recording medium using procedures described below.

Holographic recording was performed using a semiconductor laser with a wavelength of 405 nm. An exposure device shown in FIG. 1 was used to perform two-beam plane-wave holographic recording at an exposure power density per beam of 7.5 mW/cm$^2$.

Multiple recording was performed 61 times in the same position of the medium in steps of 1° in the range of from −30° to 30°, and the sum of the square root of diffraction efficiency values was used as M/# (M number).

Details will next be described.

(Holographic Recording)

FIG. 1 is a structural diagram showing the outline of the device used for holographic recording.

In FIG. 1, S represents a holographic recording medium sample, and M1 to M3 represent mirrors. PBS represents a polarizing beam splitter. L1 represents a recording laser light source emitting light with a wavelength of 405 nm (a single mode laser ("L1" in FIG. 1) manufactured by TOPTICA Photonics and capable of emitting light with a wavelength of about 405 nm), and L2 represents a reproduction laser light source emitting light with a wavelength of 633 nm. PD1, PD2, and PD3 represent photodetectors. 1 represents an LED unit.

As shown in FIG. 1, a light beam with a wavelength of 405 nm was split using the polarizing beam splitter ("PBS" in the figure) into two beams intersecting on a recording surface such that the angle therebetween was 37.3°. In this case, the light beam was split such that a bisector of the angle between the two beams was perpendicular to the recording surface, and the two beams obtained by splitting the light beam were applied such that the vibration planes of the electric field vectors of the two beams were perpendicular to a plane including the two intersecting beams.

After the holographic recording, a He—Ne laser capable of emitting light with a wavelength of 633 nm (V05-LHP151 manufactured by Melles Griot: "L2" in the figure) was used, and the light was applied to the recording surface at an angle of 30.0°. The diffracted light was detected using a photo diode and a photosensor amplifier (S2281 and C9329: manufactured by Hamamatsu Photonics K.K., "PD1" in the figure) to determine whether or not the holographic recording was correctly performed. The diffraction efficiency of each hologram is given by the ratio of the intensity of the diffracted light to the sum of the intensity of transmitted light and the intensity of the diffracted light.

(Measurement of M/#)

Multiple recording was performed 61 times while the sample was moved with respect to the optical axis such that the angle between the optical axis and the sample (the angle between the normal to the sample and a bisector of the interior angle of the two beams, i.e., incident light beams from the mirrors M1 and M2 in FIG. 1, at the intersection of the beams) was changed from −30° to 30° in steps of 1°.

After the multiple recording was performed 61 times, the LED unit (1 in the figure, center wavelength 405 nm) was turned on for a given period of time to completely consume the remaining initiator and the remaining monomer. This process is referred to as postexposure. The power of the LED was 50 mW/cm$^2$, and the irradiation was performed such that the integrated energy was 3 J/cm$^2$.

Next, light (wavelength 405 nm) from the mirror M1 in FIG. 1 was applied, and the diffraction efficiency was measured in the angle range of from −30° to 30°. The sum of the square roots of the obtained diffraction efficiency values over the entire multiple recording range was used as M/#.

A plurality of optical recording mediums prepared were used. The evaluation was performed a plurality of times under different irradiation energy conditions, i.e., while the irradiation energy at the beginning of irradiation was increased or decreased and the total irradiation energy was increased or decreased. A search for conditions under which the monomer contained was almost completely consumed by the time the multiple recording was repeated 61 times (the M/# substantially reached equilibrium by the time the multiple recording was repeated 61 times) while the diffraction efficiency in each recording operation was maintained at several percent or more was performed in order to maximize the M/#. The maximum value obtained was used as the M/# of the medium.

(Computation of Sensitivity)

A value obtained by dividing a value obtained by multiplying the M/# by 0.8 by the irradiation energy applied until the M/# reached 80% was defined as sensitivity.

(Measurement of Transmittance before Recording and Transmittance after Recording)

The transmittance before recording of an evaluation sample was determined before recording by measuring the ratio of the power of the transmission light to the power of the incident light.

Moreover, the transmittance after recording of the evaluation sample subjected to postexposure was determined after recording by measuring the ratio of the power of the transmission light to the power of the incident light.

(Chromaticity)

The chromaticity of a recording section of an evaluation sample after recording was measured using a color computer (SM-5 manufactured by Suga Test Instruments Co., Ltd.). The light source used was a standard illuminant C for color measurement, and the measurement was performed using the CIE XYZ color system for a 2 degree field of view to determine the changes Δx and Δy in chromaticity from that of a blank (0.3101, 0.3162).

The holographic recording mediums produced in the Examples and Comparative Examples were evaluated using the above methods, and the results of the evaluation are shown in tables below. To measure the M/#, holographic recording mediums each having a recording layer with a thickness of 0.5 mm were used.

Example 1-1

<Preparation of TEMPOL Master Batch>

0.3 g of TEMPOL was dissolved in 2.7 g of DURANATE™ TSS-100. Next, 0.002 g of an octylic acid solution of tris(2-ethylhexanoate)bismuth was dissolved in the above mixture, and the resulting mixture was stirred at 45° C. under reduced pressure to allow the mixture to react for 2 hours. FT-IR was used to observe the disappearance of a peak at 3450 cm$^{-1}$ originating from a hydroxy group in TEMPOL to thereby check the reaction of the hydroxy group in the TEMPOL to an isocyanate group.

<Synthesis of Caprolactone-Modified Product of PTMG-650 (SH6)>

A 50 mL four-necked flask was charged with 16.25 g of PTMG-650, 8.56 g of ε-caprolactone, and 0.0125 g of stannous octoate, and a nitrogen flow tube and a reflux tube were attached. Then the mixture was allowed to react at 120° C. for 12 hours to thereby obtain a caprolactone-modified product of PTMG-650 in liquid form (number average molecular weight 1000).

<Preparation of Holographic Recording Medium Composition>

0.325 g of a polymerizable monomer BDTPA and 0.0198 g of a photopolymerization initiator HLI02 were dissolved in 4.14 g of DURANATE (™) TSS-100 to obtain solution A.

Separately, 3.06 g of SH6 and 1.65 g of PLACCEL PCL-305 (polycaprolactonetriol (molecular weight 550)) were mixed (SH6:PLACCEL PCL-305=65:35 (weight ratio)), and 0.0013 g of an octylic acid solution of tris(2-ethylhexanoate)bismuth was dissolved therein to obtain solution B.

Each of solutions A and B was degassed at 45° C. under reduced pressure for 2 hours. Then solutions A and B and the TEMPOL master batch were mixed under stirring and degassed in a vacuum for several minutes.

Then the vacuum degassed solution mixture was poured onto a microscope slide with 0.5 mm-thick spacer sheets placed on two opposite edges, and another microscope slide was placed thereon. Clips were used to fix the edges, and heating was performed at 80° C. for 24 hours to produce a holographic recording medium composition evaluation sample. In this evaluation sample, a recording layer with a thickness of 0.5 mm was formed between the microscope slides used as covers.

In this holographic recording medium composition, (PG+TMG)/((a-1)+(b-1)) was 23.9% by weight, and (CL)/((a-1)+(b-1)) was 32.3% by weight. The content of the polymerizable monomer denoted as component (c-1) was 3% by weight, and the ratio of the photopolymerization initiator denoted as component (d-1) to the polymerizable monomer denoted as component (c-1) was 6.1% by weight. The molar ratio of TEMPOL denoted as component (e-1) to the photopolymerization initiator denoted as component (d-1) was 0.72, and the ratio (OH/NCO) of hydroxy groups in component (b-1) to isocyanate groups in component (a-1) was 1.0.

Example 1-2

A holographic recording medium composition and a holographic recording medium composition evaluation sample were produced in the same manner as in Example 1-1 except that, instead of SH6 and PLACCEL PCL-305, PLACCEL PCL-205U and PLACCEL PCL-305 were used as component (b-1) at a weight ratio of PCL-205U:PCL-305=90:10.

The component composition of the holographic recording medium composition is as shown in Table 1.

Example 1-3

A holographic recording medium composition and a holographic recording medium composition evaluation sample were produced in the same manner as in Example 1-1 except that, instead of BDTPA, HLM101 was used as component (c-1), that the content thereof was 4.6% by weight, and that the component composition shown in Table 1 was used.

The component composition of the holographic recording medium composition is as shown in Table 1.

Example 1-4

A holographic recording medium composition and a holographic recording medium composition evaluation sample were produced in the same manner as in Example 1-1 except that, instead of SH6 and PLACCEL PCL-305, PTMG-650 and ADEKA POLYETHER GM-30 were used as component (b-1) at a weight ratio of PTMG-650:GM-30=65:35.

The component composition of the holographic recording medium composition is as shown in Table 1.

Example 1-5

A holographic recording medium composition and a holographic recording medium composition evaluation sample were produced in the same manner as in Example 1-1 except that, instead of SH6 and PLACCEL PCL-305, PTMG-650 and PLACCEL PCL-305 were used as component (b-1) at a weight ratio of PTMG-650:PCL-305=55:45.

The component composition of the holographic recording medium composition is as shown in Table 1.

Comparative Example 1-1

A holographic recording medium composition and a holographic recording medium composition evaluation sample were produced in the same manner as in Example 1-1 except that, instead of TEMPOL denoted as component (e-1), methyl linoleate denoted as component (g-1) was used and that, instead of SH6 and PLACCEL PCL-305, only ADEKA POLYETHER P-400 was used as component (b-1).

The component composition of the holographic recording medium composition is as shown in Table 1.

Comparative Example 1-2

A holographic recording medium composition and a holographic recording medium composition evaluation sample were produced in the same manner as in Example 1-1 except that, instead of SH6 and PLACCEL PCL-305, only ADEKA POLYETHER P-400 was used as component (b-1).

The component composition of the holographic recording medium composition is as shown in Table 1.

Comparative Example 1-3

A holographic recording medium composition and a holographic recording medium composition evaluation sample were produced in the same manner as in Example 1-1 except that, instead of TEMPOL denoted as component (e-1), TEMPO was used, that no curing catalyst was mixed when a TEMPO master batch was produced, that the TEMPO was mixed such that the molar ratio of the TEMPO to component (d-1) in the composition was 1.57, and that, instead of SH6 and PLACCEL PCL-305, only ADEKA POLYETHER P-400 was used as component (b-1).

The component composition of the holographic recording medium composition is as shown in Table 1.

Comparative Example 1-4

A holographic recording medium composition and a holographic recording medium composition evaluation sample were produced in the same manner as in Example 1-1 except that, instead of SH6 and PLACCEL PCL-305, only ADEKA POLYETHER P-400 was used as component (b-1) and that, instead of BDTPA, HLM101 was used as component (c-1) such that the content of component (c-1) in the composition was 4.6% by weight.

The component composition of the holographic recording medium composition is as shown in Table 1.

Comparative Example 1-5

A holographic recording medium composition and a holographic recording medium composition evaluation sample were produced in the same manner as in Example 1-1 except that, instead of SH6 and PLACCEL PCL-305, PTMG-650 and ADEKA POLYETHER GM-30 were used as component (b-1) at a weight ratio of PTMG-650:GM-30=99:1 and that, instead of HLI02, 2,4,6-trimethylbenzoyl-diphenyl-phosphine oxide (TPO) was used as component (d-1) such that the ratio of the amount of component (d-1) to the amount of component (c-1) in the composition was 10% by weight.

The component composition of the holographic recording medium composition is as shown in Table 1.

Comparative Example 1-6

A holographic recording medium composition and a holographic recording medium composition evaluation sample were produced in the same manner as in Example 1-1 except that, instead of SH6 and PLACCEL PCL-305, PTMG-650 and ADEKA POLYETHER GM-30 were used as component (b-1) at a weight ratio of PTMG-650:GM-30=75:25.

The component composition of the holographic recording medium composition is as shown in Table 1.

Comparative Example 1-7

A holographic recording medium composition and a holographic recording medium composition evaluation sample were produced in the same manner as in Example 1-1 except that, instead of SH6 and PLACCEL PCL-305, PTMG-650 and ADEKA POLYETHER GM-30 were used as component (b-1) at a weight ratio of PTMG-650:GM-30=70:30.

The component composition of the holographic recording medium composition is as shown in Table 1.

[Results of Evaluation of Holographic Recording Mediums Produced in Examples 1-1 to 1-5 and Comparative Examples 1-1 to 1-7]

The results of evaluation of the holographic recording mediums produced in Examples 1-1 to 1-5 and Comparative Examples 1-1 to 1-7 are shown in Table 2 below.

TABLE 1

| | Component composition | | | | | |
|---|---|---|---|---|---|---|
| | Component (b-1) (% by weight) | Component (c-1) (% by weight) | Component (d-1) [component (d-1)/ component (c-1) (% by weight)] | Component (e-1) [component (e-1)/ component (d-1) (molar ratio)] | (PG + TMG)/ ((a-1) + (b-1)) (% by weight) | (CL)/ ((a-1) + (b-1)) (% by weight) |
| Example 1-1 | SH6(65) + PCL-305(35) (OH/NCO = 1.0) | BDTPA 3 | HLI02 6.1 | TEMPOL 0.72 | 23.9 | 32.3 |
| Example 1-2 | PCL-205U(90) + PCL-305(10) (OH/NCO = 1.0) | BDTPA 3 | HLI02 6.1 | TEMPOL 0.72 | 0 | 49.8 |
| Example 1-3 | PCL-205U(90) + PCL-305(10) (OH/NCO = 1.0) | HLM101 4.6 | HLI02 4 | TEMPOL 1 | 0 | 49.8 |
| Example 1-4 | PTMG-650(65) + GM-30(35) (OH/NCO = 1.0) | BDTPA 3 | HLI02 6.1 | TEMPOL 0.72 | 28 | 0 |
| Example 1-5 | PTMG-650(55) + PCL-305(45) (OH/NCO = 1.0) | BDTPA 3 | HLI02 6.1 | TEMPOL 0.72 | 28 | 22 |
| Comparative Example 1-1 | P-400(100) (OH/NCO = 1.0) | BDTPA 3 | HLI02 6.1 | LM 0.72 | 46.7 | 0 |
| Comparative Example 1-2 | P-400(100) (OH/NCO = 1.0) | BDTPA 3 | HLI02 6.1 | TEMPOL 0.72 | 46.7 | 0 |
| Comparative Example 1-3 | P-400(100) (OH/NCO = 1.0) | BDTPA 3 | HLI02 6.1 | TEMPO 1.57 | 46.7 | 0 |
| Comparative Example 1-4 | P-400(100) (OH/NCO = 1.0) | HLM101 4.6 | HLI02 6.1 | TEMPOL 0.72 | 46.7 | 0 |
| Comparative Example 1-5 | PTMG-650(99) + GM-30(1) (OH/NCO = 1.0) | BDTPA 3 | TPO 10 | TEMPOL 0.72 | 57 | 0 |
| Comparative Example 1-6 | PTMG-650(75) + GM-30(25) (OH/NCO = 0.91) | BDTPA 3 | HLI02 6.1 | TEMPOL 0.72 | 36 | 0 |
| Comparative Example 1-7 | PTMG-650(70) + GM-30(30) (OH/NCO = 1.0) | BDTPA 3 | HLI02 6.1 | TEMPOL 0.72 | 32 | 0 |

TABLE 2

| | M/# | Sensitivity | Transmittance before recording (%) | Transmittance after recording (%) |
|---|---|---|---|---|
| Example 1-1 | 33.8 | 2.1 | 69 | 84 |
| Example 1-2 | 35.8 | 1.5 | 68 | 82 |
| Example 1-3 | 43.6 | 1.3 | 68 | 86 |
| Example 1-4 | 30.1 | 1 | 68 | 79 |
| Example 1-5 | 30.9 | 1 | 68 | 83 |
| Comparative Example 1-1 | 16.7 | 1.7 | 69 | 80 |
| Comparative Example 1-2 | 30 | 1 | 63 | 57 |
| Comparative Example 1-3 | 14.7 | 0.66 | 64 | 59 |
| Comparative Example 1-4 | 34.7 | 0.96 | 50 | 77 |
| Comparative Example 1-5 | 34.8 | 1.5 | 61 | 56 |
| Comparative Example 1-6 | 32.3 | 1.1 | 65 | 84 |
| Comparative Example 1-7 | 31 | 1.1 | 65 | 82 |

The following can be seen from Tables 1 and 2.

In each of the compositions in Examples 1-1 to 1-5 and Comparative Examples 1-1 to 1-7, the concentration of the initiator added was adjusted such that the design transmittance was 70% (the design transmittance −1 to −2%).

In Comparative Example 1-1, the transmittance before recording was 69% (design transmittance −1%). However, in Comparative Examples 1-2 to 1-7, the transmittance before recording was 50 to 65% (design transmittance −5% to −20%), and a reduction in the transmittance before recording was found. The reduction in transmittance at 405 nm indicates that the medium is tinted yellow. In the AR glass light guide plate applications, the coloration of the medium is not preferred because the field of view is tinted. In the memory applications, signals are recorded and reproduced using a 405 nm laser, and a reduction in transmittance causes a reduction in transfer rate.

In Examples 1-1 to 1-5, a reduction in the transmittance before recording was within 1 to 2%. When the reduction in transmittance is within the above range, the coloration of the field of view when AR glasses are worn and the reduction in transfer rate of a memory can be prevented.

As can be seen from Comparative Examples 1-1 to 1-7 and Examples 1-2 to 1-5, this phenomenon occurs due to the interaction of stable nitroxyl radicals with the propylene glycol unit and the tetramethylene glycol unit in component (b-1). Although the detailed mechanism is unknown, the stable nitroxyl radicals oxidize the main chains of the propylene glycol unit and the tetramethylene glycol unit, and this may cause coloration. As can be seen from the results in Example 1-1, when the amount of the propylene glycol unit and the tetramethylene glycol contained in the matrix is 30% by weight or less, the reduction in transmittance can be substantially neglected.

Reference Example 1

To find the relation between the type of polyol and coloration, a composition for a Reference Example containing no polymerizable monomer denoted as component (c-1) and no photopolymerization initiator denoted as component (d-1) was produced.

The composition for the Reference Example was produced in the same manner as in Example 1-1. Specifically, 2.62 g of TSS-100, 2.82 g of P-400, and 0.556 g of the TEMPOL master batch were mixed.

In the composition for the Reference Example, the amount of the propylene glycol unit in the urethane matrix was 46.7% by weight, and TEMPOL was contained in the composition in an amount of 900 ppm.

Reference Examples 2 to 10

Compositions for Reference Examples were produced in the same manner as in Reference Example 1 except that one or two of materials shown in Table 3 below was used instead of P-400.

SH6 used in Reference Example 4 is a caprolactone-modified product of PTMG-650 produced in Example 1-1.

In Table 3, numerical values in parentheses in the component (b-1) column indicate weight ratios of materials used.

TABLE 3

| | Component (b-1) (% by weight) | Details |
|---|---|---|
| Reference Example 1 | P-400(100) | Polypropylene glycol |
| Reference Example 2 | PTMG-650 (75) + GM-30 (25) | Polytetramethylene glycol + ethylene oxide-modified product of trimethylolpropane |
| Reference Example 3 | PCL-205U(100) | Polycaprolactonediol |
| Reference Example 4 | SH6(100) | Caprolactone-modified product of PTMG-650 |
| Reference Example 5 | PCL-305(100) | Polycaprolactonetriol |
| Reference Example 6 | PCL-303(100) | Polycaprolactonetriol |
| Reference Example 7 | NIPPOLLAN 141(100) | Polyesterpolyol |
| Reference Example 8 | NIPPOLLAN 1100(100) | Polyesterpolyol |
| Reference Example 9 | NL1050B(100) | Polycarbonatediol |
| Reference Example 10 | BY16-750(100) | Hydroxy-terminated polydimethylsiloxane |

[Measurement of Ultraviolet-Visible Light Absorption Spectra of Compositions for Reference Examples]

A spectrophotometer V-670 manufactured by JASCO was used to measure the ultraviolet-visible light absorption spectrum of each of the compositions for Reference Examples. One microscope slide was used as a reference.

Figure 2:
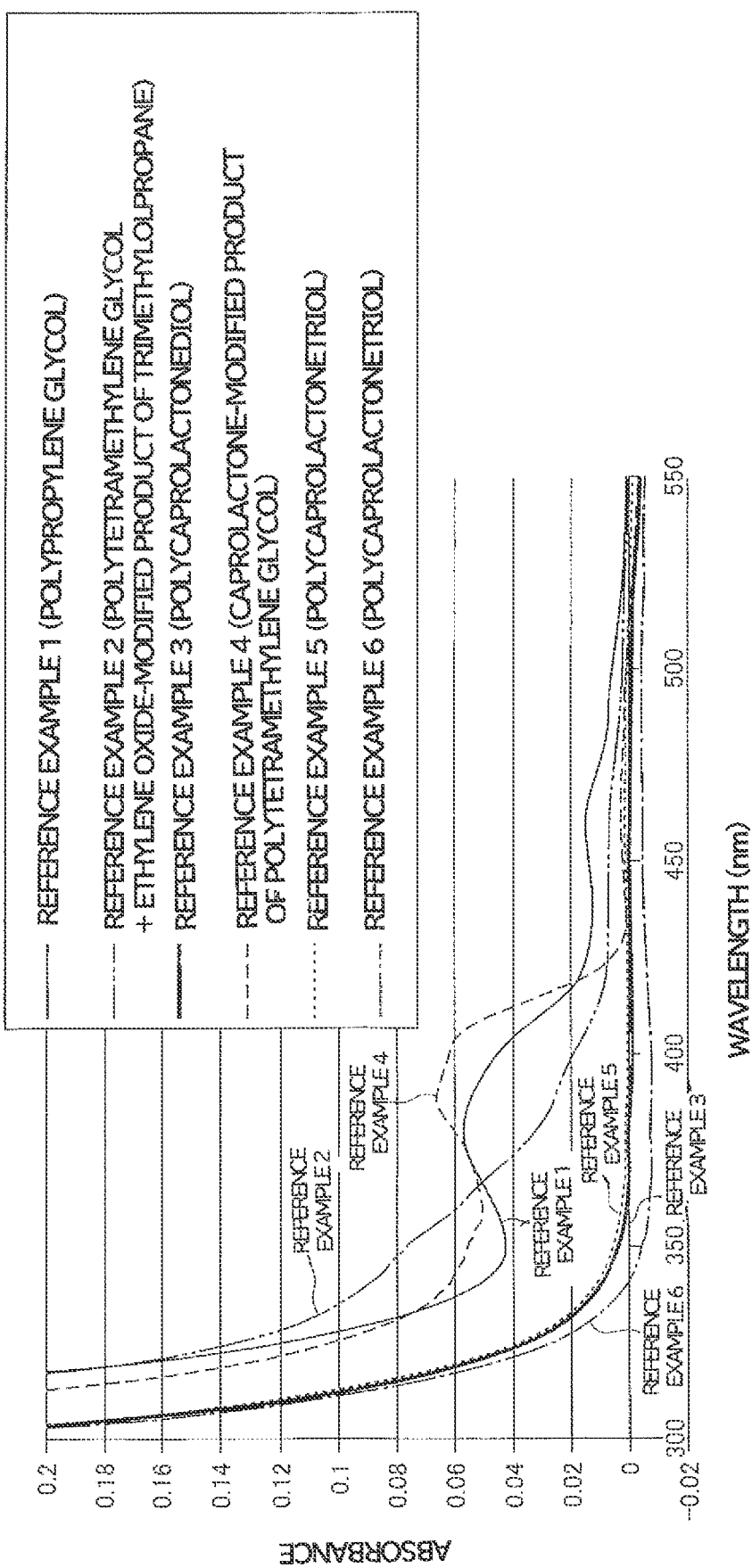
FIG. 2 is a chart showing ultraviolet-visible light absorption spectra in Reference Examples 1 to 6.
Figure 3:
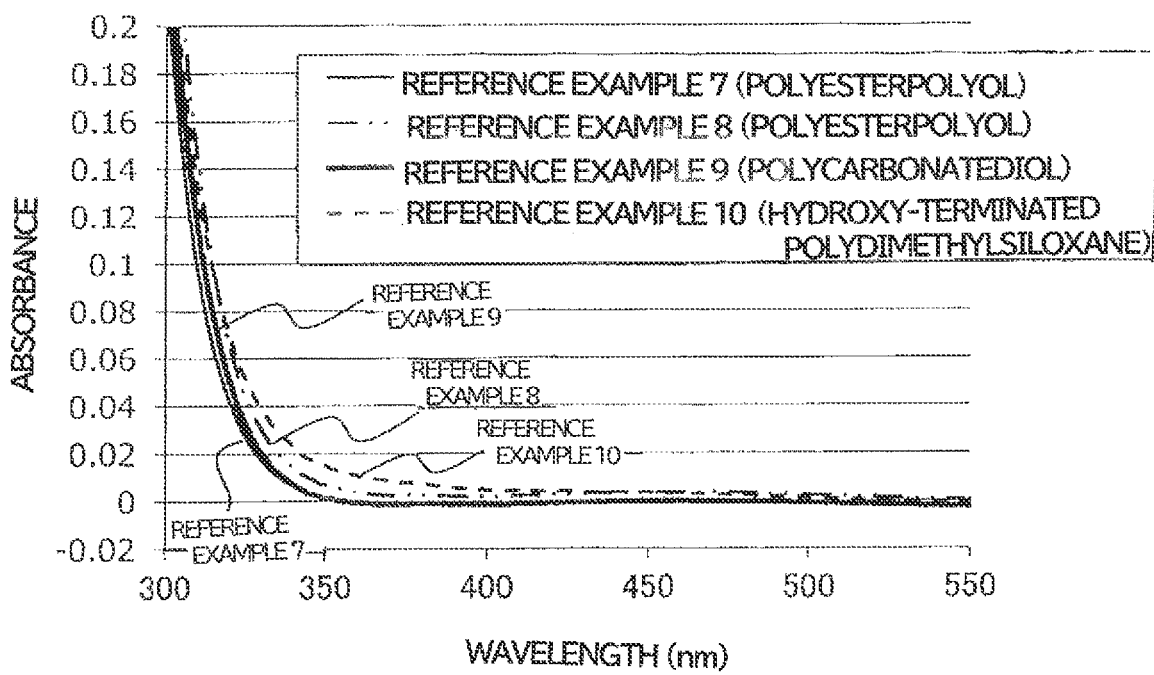
FIG. 3 is a chart showing ultraviolet-visible light absorption spectra in Reference Examples 7 to 10.

The ultraviolet-visible light absorption spectra measured are shown in FIGS. 2 and 3.

As can be seen from FIG. 2, when polypropylene glycol, polytetramethylene glycol, or the caprolactone-modified product of polytetramethylene glycol was used as component (b-1), coloration occurred. When polycaprolactonepolyol was used, coloration was prevented.

As can be seen from FIG. 3, when polyesterpolyol, polycarbonatediol, or hydroxy-terminated polydimethylsiloxane was used as component (b-1), coloration was prevented.

Example 2-1

<Preparation of TEMPOL Master Batch>

0.3 g of TEMPOL was dissolved in 2.7 g of DURANATE(™) TSS-100. Next, 0.002 g of an octylic acid solution of tris(2-ethylhexanoate)bismuth was dissolved in the above mixture, and the resulting mixture was stirred at 45° C. under reduced pressure to allow the mixture to react for 2 hours. FT-IR was used to observe the disappearance of a peak at 3450 cm$^{-1}$ originating from a hydroxy group in TEMPOL to thereby check the reaction of the hydroxy group in the TEMPOL to an isocyanate group.

<Preparation of Holographic Recording Medium Composition>

0.386 g of a polymerizable monomer HLM101 and 0.0154 g of a photopolymerization initiator HLI02 were dissolved in 3.76 g of DURANATE(™) TSS-100 to obtain solution A.

Separately, 3.00 g of PLACCEL PCL-205U (polycaprolactonediol (molecular weight 530)) and 0.33 g of PLACCEL PCL-305 (polycaprolactonetriol (molecular weight 550)) were mixed (PLACCEL PCL-205U:PLACCEL PCL-305=90:10 (weight ratio)), and 0.0004 g of an octylic acid solution of tris(2-ethylhexanoate)bismuth was dissolved therein to obtain solution B.

Each of solutions A and B was degassed at 45° C. under reduced pressure for 2 hours. Then solutions A and B and the TEMPOL master batch were mixed under stirring and degassed in a vacuum for several minutes.

Then the vacuum degassed solution mixture was poured onto a microscope slide with 0.5 mm-thick spacer sheets placed on two opposite edges, and another microscope slide was placed thereon. Clips were used to fix the edges, and heating was performed at 80° C. for 24 hours to produce a holographic recording medium composition evaluation sample. In this evaluation sample, a recording layer with a thickness of 0.5 mm was formed between the microscope slides used as covers.

In this holographic recording medium composition, (PG+TMG)/((a-1)+(b-1)) was 0% by weight, and (CL)/((a-1)+(b-1)) was 49.8% by weight. The content of the polymerizable monomer denoted as component (c-1) was 4.6% by weight, and the ratio of the photopolymerization initiator denoted as component (d-1) to the polymerizable monomer denoted as component (c-1) was 4% by weight. The molar ratio of TEMPOL denoted as component (e-1) to the photopolymerization initiator denoted as component (d-1) was 0.24, and the ratio (OH/NCO) of hydroxy groups in component (b-1) to isocyanate groups in component (a-1) was 1.0.

Examples 2-2 to 2-4

Holographic recording medium compositions and holographic recording medium composition evaluation samples were produced in the same manner as in Example 2-1 except that the TEMPOL master batch was added such that the molar ratio of TEMPOL to the photopolymerization initiator denoted as component (d-1) was equal to a value shown in Table 4.

The component composition of each of the holographic recording medium compositions is as shown in Table 4.

Example 2-8

A holographic recording medium composition and a holographic recording medium composition evaluation sample were produced in the same manner as in Example 2-2 except that, instead of HLI02 denoted as component (d-1), PIO16 was added such that the ratio of the PIO16 to the photopolymerization initiator denoted as component (c-1) was 4.7% by weight.

The component composition of the holographic recording medium composition is as shown in Table 4.

Comparative Example 2-1

A holographic recording medium composition and a holographic recording medium composition evaluation sample were produced in the same manner as in Example 2-1 except that, instead of TEMPOL, methyl linoleate denoted as component (g-1) was used and added such that the molar ratio of the methyl linoleate to the photopolymerization initiator denoted as component (d-1) was 0.72.

The component composition of the holographic recording medium composition is as shown in Table 4.

Comparative Example 2-3

A holographic recording medium composition and a holographic recording medium composition evaluation sample were produced in the same manner as in Example 2-8 except that, instead of TEMPOL, methyl linoleate denoted as component (g-1) was used and added such that the molar ratio of the methyl linoleate to the photopolymerization initiator denoted as component (d-1) was 0.72.

The component composition of the holographic recording medium composition is as shown in Table 4.

Example 2-5

A holographic recording medium composition and a holographic recording medium composition evaluation sample were produced in the same manner as in Example 2-1 except that BDTPA was added as the polymerizable monomer denoted as component (c-1) such that the content of component (c-1) in the composition was 3% by weight and that the ratio of the photopolymerization initiator denoted as component (d-1) to component (c-1) was 6.1% by weight.

The component composition of the holographic recording medium composition is as shown in Table 5.

Example 2-6

A holographic recording medium composition and a holographic recording medium composition evaluation sample were produced in the same manner as in Example 2-1 except that, instead of TEMPOL denoted as component (e-1), TEMPO was used, that no curing catalyst was mixed when a TEMPO master batch was produced, and that the TEMPO master batch was mixed such that the ratio of component (d-1) to component (c-1) was 4% by weight.

The component composition of the holographic recording medium composition is as shown in Table 5.

Example 2-7

A holographic recording medium composition and a holographic recording medium composition evaluation sample were produced in the same manner as in Example 2-1 except that, instead of TEMPOL denoted as component (e-1), nor-AZADO was used and added such that the molar ratio of the nor-AZADO to the photopolymerization initiator denoted as component (c-1) was 0.81.

The component composition of the holographic recording medium composition is as shown in Table 5.

Comparative Example 2-2

A holographic recording medium composition and a holographic recording medium composition evaluation sample were produced in the same manner as in Example 2-5 except that, instead of TEMPOL denoted as component (e-1), methyl linoleate denoted as component (g-1) was used.

The component composition of the holographic recording medium composition is as shown in Table 5.

[Results of Evaluation of Holographic Recording Mediums Produced in Examples 2-1 to 2-8 and Comparative Examples 2-1 to 2-3]

The results of evaluation of the holographic recording mediums produced in Examples 2-1 to 2-8 and Comparative Examples 2-1 to 2-3 are shown in Tables 4 and 5 below.

Figure 4:
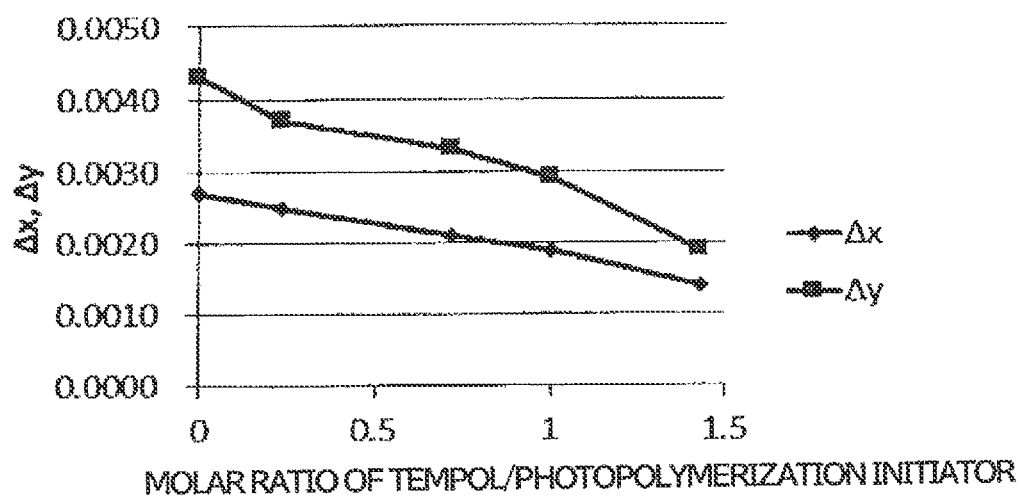
FIG. 4 is a graph showing the relations between the molar ratio of TEMPOL/a photopolymerization initiator and $\Delta x$ and between the molar ratio and $\Delta y$ in Examples 2-1 to 2-4 and Comparative Example 2-1.

A graph of the relations between $\Delta x$ and the molar ratio of TEMPOL/the photopolymerization initiator and between $\Delta y$ and the molar ratio of TEMPOL/the photopolymerization initiator in Examples 2-1 to 2-4 and Comparative Example 2-1 is shown in FIG. 4. In Comparative Example 2-1, no TEMPOL was used, and the molar ratio of TEMPOL/the photopolymerization initiator is 0.

TABLE 4

| | Component composition | | | | Evaluation results | | | | |
| --- | --- | --- | --- | --- | --- | --- | --- | --- | --- |
| | Component (b-1) (% by weight) | Component (c-1) (% by weight) | Component (d-1) [component (d-1)/ component (c-1) (% by weight)] | Component (e-1) component (e-1)/ component (d-1) (molar ratio)] | M/# | Sensi- tivity | Trans- mittance before recording (%) | Trans- mittance after recording (%) | Chromaticity Δx | Δy |
| Comparative Example 2-1 | PCL-205U(90) + PCL-305(10) (OH/NCO = 1.0) | HLM101 4.6 | HLI02 4 | LM 0.72 | 21.1 | 0.81 | 68 | 82 | 0.0027 | 0.0043 |
| Example 2-1 | PCL-205U(90) + PCL-305(10) (OH/NCO = 1.0) | HLM101 4.6 | HLI02 4 | TEMPOL 0.24 | 25.4 | 1.2 | 68 | 81 | 0.0025 | 0.0037 |
| Example 2-2 | PCL-205U(90) + PCL-305(10) (OH/NCO = 1.0) | HLM101 4.6 | HLI02 4 | TEMPOL 0.72 | 38.3 | 1.2 | 68 | 78 | 0.0021 | 0.0033 |
| Example 2-3 | PCL-205U(90) + PCL-305(10) (OH/NCO = 1.0) | HLM101 4.6 | HLI02 4 | TEMPOL 1 | 43.6 | 1.5 | 68 | 86 | 0.0019 | 0.0029 |
| Example 2-4 | PCL-205U(90) + PCL-305(10) (OH/NCO = 1.0) | HLM101 4.6 | HLI02 4 | TEMPOL 1.43 | 19.4 | 0.55 | 68 | 85 | 0.0014 | 0.0019 |
| Example 2-8 | PCL-205U(90) + PCL-305(10) (OH/NCO = 1.0) | HLM101 4.6 | PIO16 4.7 | TEMPOL 0.72 | 38.1 | 1.4 | 68 | 78 | 0.0033 | 0.0050 |
| Comparative Example 2-3 | PCL-205U(90) + PCL-305(10) (OH/NCO = 1.0) | HLM101 4.6 | PIO16 4.7 | LM 0.72 | 19.7 | 0.74 | 68 | 82 | 0.0043 | 0.0057 |

TABLE 5

| | Component composition | | | | Evaluation results | | | | |
| --- | --- | --- | --- | --- | --- | --- | --- | --- | --- |
| | Component (b-1) (% by weight) | Component (c-1) (% by weight) | Component (d-1) [component (d-1)/ component (c-1) (% by weight)] | Component (e-1) component (e-1)/ component (d-1) (molar ratio)] | M/# | Sensi- tivity | Trans- mittance before recording (%) | Trans- mittance after recording (%) | Chromaticity Δx | Δy |
| Comparative Example 2-2 | PCL-205U(90) + PCL-305(10) (OH/NCO = 1.0) | BDTPA 3 | HLI02 6.1 | LM 0.72 | 17.4 | 1.5 | 69 | 84 | 0.0027 | 0.0037 |
| Example 2-5 | PCL-205U(90) + PCL-305(10) (OH/NCO = 1.0) | BDTPA 3 | HLI02 6.1 | TEMPOL 0.72 | 35.8 | 1.5 | 68 | 82 | 0.0013 | 0.0017 |

TABLE 5-continued

| | Component composition | | | | Evaluation results | | | | |
|---|---|---|---|---|---|---|---|---|---|
| | Component (b-1) | Component (c-1) (% by weight) | Component (d-1) [component (d-1)/ component (c-1) (% by weight)] | Component (e-1) component (e-1)/ component (d-1) (molar ratio)] | M/# | Sensitivity | Transmittance before recording (%) | Transmittance after recording (%) | Chromaticity | |
| | (% by weight) | | | | | | | | Δx | Δy |
| Example 2-6 | PCL-205U(90) + PCL-305(10) (OH/NCO = 1.0) | HLM101 4.6 | HLI02 4 | TEMPO 0.72 | 15.7 | 0.33 | 68 | 77 | 0.0018 | 0.0029 |
| Example 2-7 | PCL-205U(90) + PCL-305(10) (OH/NCO = 1.0) | HLM101 4.6 | HLI02 4 | nor-AZADO 0.81 | 18.6 | 0.45 | 68 | 83 | 0.0023 | 0.0034 |

The following can be seen from Tables 4 and 5.

In each of the compositions in Examples 2-1 to 2-8 and Comparative Example 2-1 to 2-3, the concentration of the photopolymerization initiator added was adjusted such that the transmittance before recording was 70% (the design transmittance −1 to −2%), and the measured values reflect the amounts added.

In Comparative Example 2-1, the amounts of change Δx and Δy in chromaticity after exposure from that of the blank were (0.0027, 0.0043). The results show that, unlike the blank, the holographic recording medium after postexposure is tinted yellow. In the optical element applications such as light guide plates for AR glasses, the coloration of the medium is not preferred because the field of view is tinted. In the memory applications, signals are recorded and reproduced using a 405 nm laser, and a reduction in transmittance due to coloration causes a reduction in transfer rate.

In Examples 2-1 to 2-8, the addition of TEMPOL, TEMPO, or nor-AZADO denoted as component (e-1) reduced the amounts of change (Δx, Δy) in chromaticity. The results show that the coloration of the holographic recording medium after postexposure is reduced. Therefore, the coloration of the field of view when AR glasses are worn and the reduction in transfer rate of a memory can be prevented.

As is clear from the results in Comparative Example 2-1 and Examples 2-1 to 2-8, this effect is obtained by the addition of TEMPOL, TEMPO, or nor-AZADO.

As can be seen from the results in Comparative Example 2-2 and Example 2-5, this effect is obtained irrespective of the type of polymerizable monomer denoted as component (c-1).

As can be seen from the results in Comparative Example 2-3 and Example 2-8, the effect is obtained irrespective of the type of oxime ester-based photopolymerization initiator denoted as component (d-1).

As can be seen from the results in Comparative Example 2-1 and Examples 2-1 to 2-8, the effect is obtained irrespective of the type of stable nitroxyl radical denoted as component (e-1).

It may be considered that the coloration after postexposure occurs because iminyl radicals generated by cleavage of the oxime ester-based photopolymerization initiator denoted as component (d-1) form a dimer (complex). The stable nitroxyl radicals denoted as component (e-1) in the composition may trap the iminyl radicals, and the formation of a dimer is thereby reduced. This may be the reason that the coloration after postexposure is reduced.

Although the present invention has been described in detail by way of the specific modes, it is apparent for those skilled in the art that various changes can be made without departing from the spirit and scope of the present invention.

The present application is based on Japanese Patent Application No. 2018-111209 filed on Jun. 11, 2018 and Japanese Patent Application No. 2018-111210 filed on Jun. 11, 2018, the entire contents of which are incorporated herein by reference.

REFERENCE SIGNS LIST

S holographic recording medium
M1, M2, M3 mirror
L1 semiconductor laser light source for recording light
L2 laser light source for reproduction light
PD1, PD2, PD3 photodetector
PBS polarizing beam splitter
1 LED unit

The invention claimed is:

1. A holographic recording medium composition, comprising:
   component (a-1): an isocyanate group-containing compound;
   component (b-1): which consists of at least one isocyanate-reactive functional group-containing compound containing two or more isocyanate-reactive functional groups;
   component (c-1): a polymerizable monomer;
   component (d-1): a photopolymerization initiator; and
   component (e-1): a stable nitroxyl radical group-containing compound,
   wherein
   a ratio of a total weight of a propylene glycol unit and a tetramethylene glycol unit in the component (b-1) to a total weight of the component (a-1) and the component (b-1) is 30.0% or less;
   a ratio of a weight of a caprolactone unit in the component (b-1) to the total weight of the component (a-1) and the component (b-1) is 20% or more; and
   the holographic recording medium composition does not comprise a chain transfer agent.

2. The holographic recording medium composition according to claim 1, wherein the photopolymerization initiator is a photopolymerization initiator containing an oxime ester-based photopolymerization initiator.

3. The holographic recording medium composition according to claim 2, wherein the oxime ester-based photopolymerization initiator is a compound represented by formula (4) below:

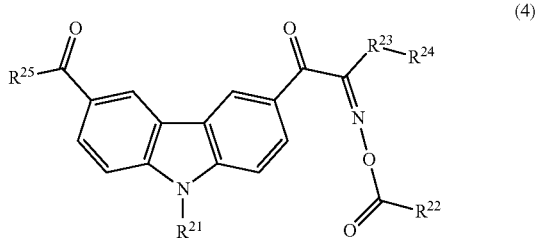

(4)

where, $R^{21}$ represents an alkyl group;

$R^{22}$ represents an alkyl group, an aryl group, or an aralkyl group;

$R^{23}$ represents a —$(CH_2)_m$— group, m being an integer of 1 or more and 6 or less;

$R^{24}$ represents a hydrogen atom or any substituent; and $R^{25}$ represents any substituent having no multiple bond conjugated with a carbonyl group bonded to $R^{25}$.

4. The holographic recording medium composition according to claim 3, wherein $R^{24}$ represents an alkyl group, an alkoxycarbonyl group, an aromatic ring group, or a heterocyclic group; and $R^{25}$ represents an alkyl group optionally having a substituent.

5. The holographic recording medium composition according to claim 1, wherein the at least one isocyanate-reactive functional group containing compound contains a polycaprolactonepolyol.

6. The holographic recording medium composition according to claim 1, wherein the polymerizable monomer denoted as component (c-1) is a (meth)acrylic-based monomer.

7. The holographic recording medium composition according to claim 1, wherein the polymerizable monomer denoted as component (c-1) has a molecular weight of 300 or more.

8. The holographic recording medium composition according to claim 1, wherein the component (e-1) is 4-hydroxy-2,2,6,6-tetramethylpiperidine-1-oxyl.

9. The holographic recording medium composition according to claim 1, wherein a molar ratio of the component (e-1) to the component (d-1) in the composition is 0.1 or more and 10 or less.

10. The holographic recording medium composition according to claim 1, wherein a content of the component (c-1) in the composition is 0.1% by weight or more and 80% by weight or less, and a ratio of the component (d-1) relative to the component (c-1) is 0.1% by weight or more and 20% by weight or less.

11. The holographic recording medium composition according to claim 1, wherein the total weight of the component (a-1) and the component (b-1) in the composition is 0.1% or more and 99.9% or less, and a ratio of the number of isocyanate-reactive functional groups in the component (b-1) to the number of isocyanate groups in the component (a-1) is 0.1 or more and 10.0 or less.

12. The holographic recording medium composition according to claim 1, further comprising:

component (f-1): a curing catalyst.

13. A cured product for a holographic recording medium, wherein the cured product is obtained by a process comprising curing the holographic recording medium composition according to claim 1.

14. A stacked body for a holographic recording medium, the stacked body comprising: a recording layer formed from the cured product for a holographic recording medium according to claim 13; and a support.

15. A holographic recording medium, obtained by a process comprising subjecting the stacked body for a holographic recording medium according to claim 14 to interference exposure.

16. A holographic recording medium, obtained by a process comprising subjecting the cured product for a holographic recording medium according to claim 13 to interference exposure.

17. The holographic recording medium according to claim 16, wherein amounts of change Δx and Δy in chromaticity in a CIE XYZ color system for a 2 degree field of view from a chromaticity of a blank are 0.0040 or less, the chromaticity being measured using an illuminant C light source.

18. The holographic recording medium according to claim 16, wherein the holographic recording medium is a light guide plate for augmented reality glasses.

* * * * *